(12) United States Patent
Theuss et al.

(10) Patent No.: US 11,899,047 B1
(45) Date of Patent: Feb. 13, 2024

(54) MAGNETIC FIELD SHAPING FOR MAGNETIC FIELD CURRENT SENSOR

(71) Applicant: Infineon Technologies AG, Neubiberg (DE)

(72) Inventors: Horst Theuss, Wenzenbach (DE); Rainer Markus Schaller, Saal a.d. Donau (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/047,479

(22) Filed: Oct. 18, 2022

(51) Int. Cl.
 *G01R 15/20* (2006.01)
 *G01R 19/10* (2006.01)

(52) U.S. Cl.
 CPC .......... *G01R 15/202* (2013.01); *G01R 19/10* (2013.01)

(58) Field of Classification Search
 CPC .............................. G01R 15/202; G01R 19/10
 USPC .................................. 324/126, 76.11, 207.13
 See application file for complete search history.

(56) References Cited

U.S. PATENT DOCUMENTS

| | | | | |
|---|---|---|---|---|
| 2014/0176118 A1* | 6/2014 | Madsen | ................. | G01R 19/10 324/117 H |
| 2022/0099706 A1* | 3/2022 | Bartlett | ................. | G01R 15/181 |
| 2023/0094577 A1* | 3/2023 | Kranz | ................... | G01R 19/10 324/114 |

OTHER PUBLICATIONS

Current Sensors. Allegro MicroSystems, Inc., 11 pages [Retrieved on Sep. 26, 2022 from https://www.allegromicro.com/en/products/sense/current-sensor-ics].
Shorman, "Techniques to Minimize Common-Mode Field Interference When Using Allegro Current Sensor ICs (ACS724/5 and ACS780/1)," Allegro MicroSystems, Inc., Oct. 7, 2019, 6 pages. [Retrieved on Sep. 26, 2022 from https://www.allegromicro.com/en/insights-and-innovations/technical-documents/hall-effect-sensor-ic-publications/techniques-minimize-common-mode-field-interference].
Milano, "Achieving Closed-Loop Accuracy in Open-Loop Current Sensors," Allegro MicroSystems, Inc., May 28, 2019, 6 pages. [Retrieved on Sep. 26, 2022 from https://www.allegromicro.com/en/insights-and-innovations/technical-documents/hall-effect-sensor-ic-publications/techniques-minimize-common-mode-field-interference].

\* cited by examiner

*Primary Examiner* — Giovanni Astacio-Oquendo
(74) *Attorney, Agent, or Firm* — Harrity & Harrity, LLP

(57) ABSTRACT

A current sensor system includes a magnetic field sensor including a chip plane, a first set of sensor elements sensitive to a first magnetic field component that is aligned in a first direction that is parallel to the chip plane, and a second set of sensor elements sensitive to a second magnetic field component that is aligned in a second direction that is perpendicular to the chip plane; and three conductor structures arranged in parallel to each other and configured to carry a current parallel or antiparallel to a third direction that is perpendicular to the first direction and to the second direction. The three conductor structures generate three magnetic fields based on the current flowing therethrough, where the three magnetic fields produce a first magnetic field distribution of the first magnetic field component and a second magnetic field distribution of the second magnetic field component.

32 Claims, 16 Drawing Sheets

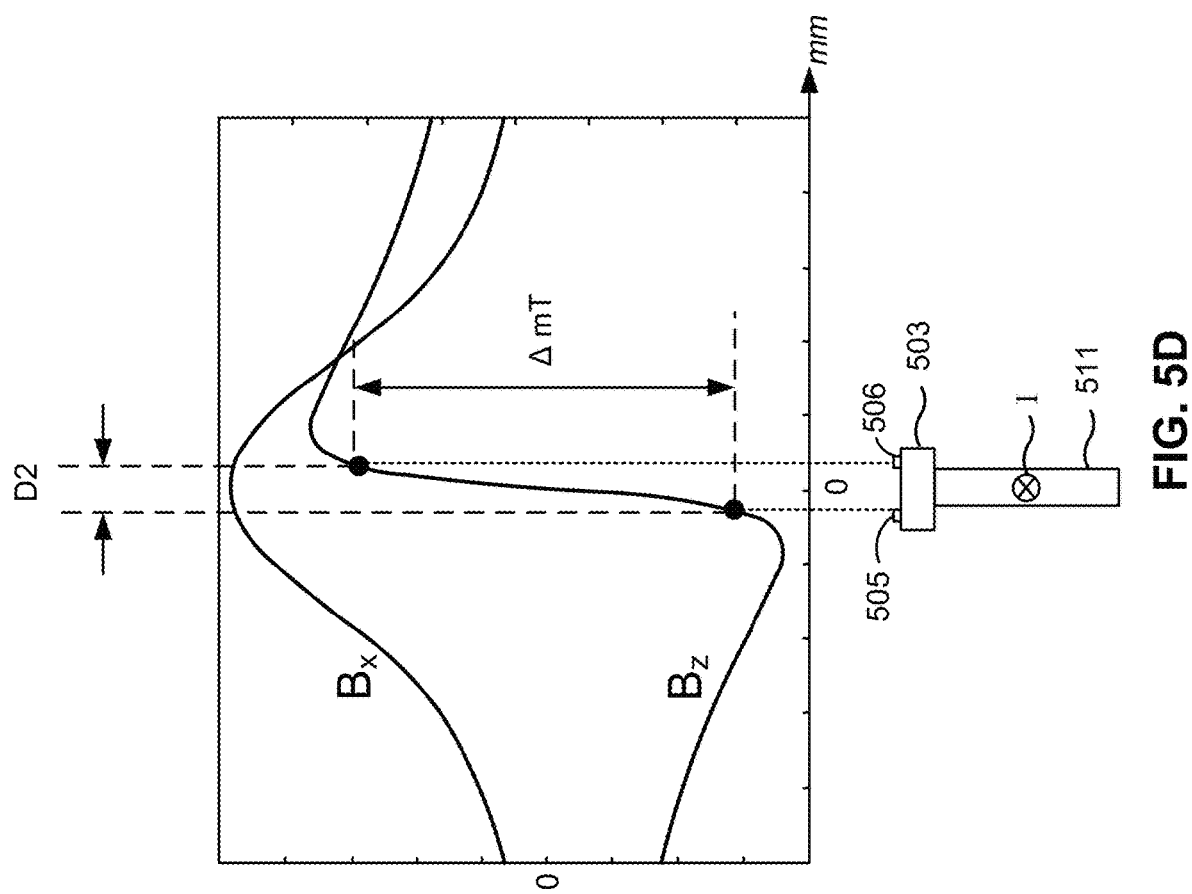

MAGNETIC FIELD SHAPING FOR MAGNETIC FIELD CURRENT SENSOR

BACKGROUND

There are many applications in which measuring an electric current is desired. As one example, it may be desired to measure one or more electric currents of a battery system of an electric vehicle. In another example, it may be desired to measure one or more electric currents provided to a load, such as an electric motor. In yet further examples, it may be desired to measure one or more electric currents of a power distribution system or one or more electric currents in a circuit.

Because an electric current flowing through a current-carrying conductor produces a magnetic field with a magnetic field flux density that is proportional to a magnitude of the electric current, magnetic field sensors can be used as current sensors. By placing a magnetic field sensor near the current-carrying conductor, the magnetic field sensor can generate a measurable quantity, such as a voltage, that is proportional to the magnetic field sensed by the magnetic field sensor. However, it is noted that the magnetic field flux density in a space around the current-carrying conductor reduces inversely with increasing distance from the current-carrying conductor. Therefore, a sensor element of the magnetic field sensor are placed in close proximity to the current-carrying conductor.

SUMMARY

In some implementations, a current sensor system includes a magnetic field sensor including a chip plane, a first set of sensor elements sensitive to a first magnetic field component that is aligned in a first direction that is parallel to the chip plane, and a second set of sensor elements sensitive to a second magnetic field component that is aligned in a second direction that is perpendicular to the chip plane, wherein the first set of sensor elements include a first sensor element and a second sensor element, and wherein the second set of sensor elements include a third sensor element and a fourth sensor element; a first conductor structure that traverses a first part of the current sensor system in a third direction that is perpendicular to the first direction and the second direction, wherein the first conductor structure is configured to carry a current parallel to the third direction; a second conductor structure electrically connected to the first conductor structure, wherein the second conductor structure traverses a second part of the current sensor system in the third direction, wherein the second conductor structure is configured to carry the current antiparallel to the third direction; and a third conductor structure electrically connected to the second conductor structure, wherein the third conductor structure traverses a third part of the current sensor system in the third direction, wherein the third conductor structure is configured to carry the current parallel to the third direction; wherein the first conductor structure produces a first magnetic field based on the current flowing therethrough, wherein the second conductor structure produces a second magnetic field based on the current flowing therethrough, wherein the third conductor structure produces a third magnetic field based on the current flowing therethrough, and wherein the first magnetic field, the second magnetic field, and the third magnetic field produce a first magnetic field distribution of the first magnetic field component and a second magnetic field distribution of the second magnetic field component.

In some implementations, a current sensor system includes a magnetic field sensor including a chip plane, a first set of sensor elements sensitive to a first magnetic field component that is aligned in a first direction that is parallel to the chip plane, and a second set of sensor elements sensitive to a second magnetic field component that is aligned in a second direction that is perpendicular to the chip plane, wherein the first set of sensor elements include a first sensor element and a second sensor element, and wherein the second set of sensor elements include a third sensor element and a fourth sensor element; a first conductor structure that traverses a first part of the current sensor system in a third direction that is perpendicular to the first direction and the second direction, wherein the first conductor structure is configured to carry a current parallel to the third direction; a second conductor structure electrically connected to the first conductor structure, wherein the second conductor structure traverses a second part of the current sensor system in the first direction, wherein the second conductor structure is configured to carry the current parallel to the first direction; and a third conductor structure electrically connected to the second conductor structure, wherein the third conductor structure traverses a third part of the current sensor system in the third direction, wherein the third conductor structure is configured to carry the current antiparallel to the third direction, wherein the first conductor structure produces a first magnetic field based on the current flowing therethrough, wherein the second conductor structure produces a second magnetic field based on the current flowing therethrough, wherein the third conductor structure produces a third magnetic field based on the current flowing therethrough, and wherein the first magnetic field, the second magnetic field, and the third magnetic field produce a first magnetic field distribution of the first magnetic field component and a second magnetic field distribution of the second magnetic field component.

In some implementations, a current sensor system includes a magnetic field sensor including a chip plane and a first set of sensor elements arranged in the chip plane and sensitive to a first magnetic field component that is aligned in a first direction that is perpendicular to the chip plane, wherein the first set of sensor elements include a first sensor element and a second sensor element; a first conductor structure that traverses a first part of the current sensor system in a conductor plane that is parallel to the chip plane, wherein the first conductor structure is configured to carry a current parallel to the chip plane; a second conductor structure that traverses a second part of the current sensor system, wherein the second conductor structure is configured to carry the current parallel to the chip plane; and a third conductor structure electrically coupled to and between the first conductor structure and the second conductor structure, wherein the third conductor structure is configured to receive the current from the first conductor structure and provide the current to the second conductor structure, wherein the third conductor structure includes: a first conductor segment that extends in the first direction from an end of the first conductor structure; a second conductor segment that extends in the first direction from an end of the second conductor structure; and a third conductor segment that extends from the first conductor segment to the second conductor segment in a second direction that is perpendicular to the first direction such that the third conductor segment extends past the magnetic field sensor.

BRIEF DESCRIPTION OF THE DRAWINGS

Implementations are described herein making reference to the appended drawings.

FIGS. 5C and 5D illustrate a magnetic sensing principle using a vertical conductor according to one or more implementations.

DETAILED DESCRIPTION

Figure 1A:
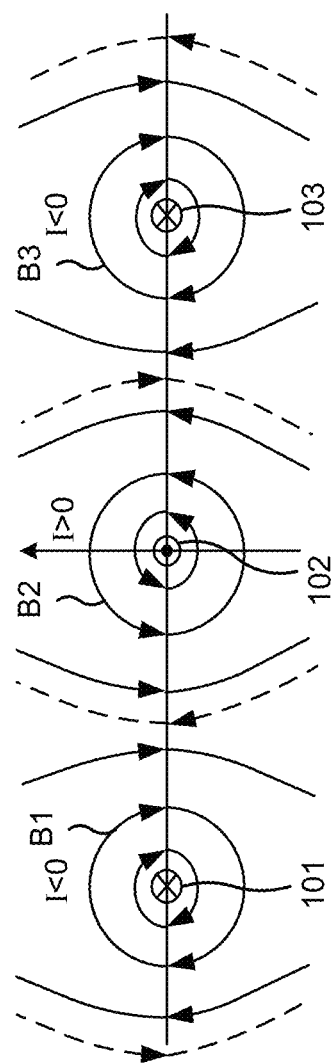
FIGS. 1A and 1B illustrate a magnetic field shaping principle according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view rather than in detail in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top," "bottom," "below," "above," "front," "behind," "back," "leading," "trailing," etc., may be used with reference to an orientation of the figures being described. Because parts of the implementations, described herein, can be positioned in a number of different orientations, the directional terminology is used for purposes of illustration and is in no way limiting. It is to be understood that other implementations may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling, e.g., any connection or coupling without additional intervening elements, may also be implemented by an indirect connection or coupling, e.g., a connection or coupling with one or more additional intervening elements, or vice versa, as long as the general purpose of the connection or coupling, for example, to transmit a certain kind of signal or to transmit a certain kind of information, is essentially maintained. Features from different implementations may be combined to form further implementations. For example, variations or modifications described with respect to one of the implementations may also be applicable to other implementations unless noted to the contrary.

The terms "substantially" and "approximately" may be used herein to account for small manufacturing tolerances (e.g., within 5%) that are deemed acceptable in the industry without departing from the aspects of the implementations described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A sensor may refer to a component which converts a property to be measured to an electric signal, for example, a current signal or a voltage signal. The property may, for example, comprise a magnetic field, an electric field, a pressure, a force, a current, or a voltage, but is not limited thereto. It will be appreciated that there are various sensor techniques for measuring current, as will be described below.

A magnetic field sensor, for example, is a semiconductor chip (e.g., a sensor chip) that includes one or more magnetic field sensor elements, referred herein as simply "sensor elements," that measure one or more characteristics of a magnetic field (e.g., an amount of magnetic field flux density, a field strength, a field angle, a field direction, a field orientation, etc.). A sensor element is configured to generate a sensor signal (e.g., a voltage) in response to one or more magnetic fields impinging on the sensor element. Thus, the sensor signal is indicative of a magnitude and/or the field orientation of at least one magnetic field impinging on the sensor element. The semiconductor chip may further include circuitry for processing and outputting one or more sensor signals generated by the one or more sensor elements.

The magnetic field may be produced by a magnet, a current-carrying conductor (e.g., a wire, a lead frame, or a busbar), the Earth, or another magnetic field source. A sensor element has a "sensitivity axis" or "sensing axis." The sensor element is sensitive to a magnetic field component of a magnetic field that is projected onto or aligned with the sensitivity axis. A magnetic field component may be, for example, an x-magnetic field component Bx, a y-magnetic field component By, or a z-magnetic field component Bz.

The x-magnetic field component Bx and the y-magnetic field component By are aligned in-plane to the semiconductor chip and the z-magnetic field component Bz is aligned out-of-plane to the semiconductor chip in the examples provided herein.

Magnetic field sensors include magnetoresistive sensors and Hall-effect sensors (Hall sensors), for example. Magnetoresistance is a property of a material to change a value of its electrical resistance when an external magnetic field is applied to the material. Some examples of various magnetoresistive effects are Giant Magneto-Resistance (GMR), which is a quantum mechanical magnetoresistance effect observed in thin-film structures composed of alternating ferromagnetic and non-magnetic conductive layers; Tunnel Magneto-Resistance (TMR), which is a magnetoresistive effect that occurs in a magnetic tunnel junction (MTJ), which is a component including two ferromagnets separated by a thin insulator; or Anisotropic Magneto-Resistance (AMR), which is a property of a material in which a dependence of electrical resistance on an angle between a direction of electric current and a direction of magnetization is observed. For example, in the case of AMR sensors, a resistance for an AMR sensor element changes according to a square of a sine of an angle of the magnetic field component projected on the sensitivity axis of the ARM sensor element.

The various magnetoresistive effects are commonly abbreviated as xMR, where the "x" acts as a placeholder for the various magnetoresistive effects. xMR sensors can detect the field orientation of an applied magnetic field by measuring sine and cosine angle components with monolithically integrated magnetoresistive sensor elements.

Magnetoresistive sensor elements of such xMR sensors typically include a plurality of layers, of which at least one layer is a reference layer with a reference magnetization (e.g., a reference direction). The reference magnetization provides a sensing direction that defines the sensitivity axis of a magnetoresistive sensor element. This generally means that the sensitivity axis of the magnetoresistive sensor element is parallel to a chip plane defined by a main surface of the semiconductor chip in which the magnetoresistive sensor element is integrated. As such, the magnetoresistive sensor element is sensitive to the magnetic field component that extends parallel to, or in-plane with, the main surface of the semiconductor chip. Accordingly, if a magnetic field component points exactly in a same direction with respect to the reference direction, a resistance of the magnetoresistive sensor element is at a maximum and, if the magnetic field component points exactly in the opposite direction with respect to the reference direction, the resistance of the magnetoresistive sensor element is at a minimum.

As a result, the resistance or a voltage drop across the magnetoresistive sensor element resulting from the resistance is proportional to the magnetic field and can be used as the sensor signal of the magnetoresistive sensor element. Moreover, in some applications, an xMR sensor includes a plurality of magnetoresistive sensor elements, which may have the same or different reference magnetizations.

A Hall effect sensor, or "Hall sensor" for short, is a transducer that varies its output voltage (Hall voltage) in response to a magnetic field. It is based on a Hall effect which makes use of a Lorentz force. The Lorentz force deflects moving charges in a presence of the magnetic field which is perpendicular to a current flow through a sensor element (e.g., a Hall plate) of the Hall sensor. Thereby, the sensor element can be a thin piece of semiconductor material or metal. The deflection causes a charge separation which causes a Hall electrical field. This Hall electrical field acts on the charge in an opposite direction with regard to the Lorentz force. Both forces balance each other and create a potential difference perpendicular to a direction of current flow. The potential difference can be measured as the Hall voltage and varies in a linear relationship with the magnetic field.

There are generally two types of Hall sensors, including a vertical Hall sensor and a lateral Hall sensor. The vertical Hall sensor is a magnetic field sensor constructed with its sensor element arranged perpendicular to the chip plane defined by the main surface of the semiconductor chip. In particular, the sensor element of the vertical Hall sensor may be a conductive plate having a sensor plane that extends "vertically" from the main surface of the semiconductor chip into a chip body of the semiconductor chip. The sensitivity axis of the sensor element of the vertical Hall sensor is perpendicular to the sensor plane. This generally means that the sensor element of the vertical Hall sensor is sensitive to the magnetic field component that extends parallel to, or in-plane with, the main surface of the semiconductor chip in which the sensor element is integrated. For the sensor element of the vertical Hall sensor, a voltage value is output according to the magnetic field flux density in the direction of its sensitivity axis.

On the other hand, a lateral (planar) Hall sensor is constructed with a sensor element (e.g., a Hall plate) that has a sensor plane that is parallel to the chip plane defined by the main surface of the semiconductor chip. In particular, the sensor element of the lateral Hall sensor may be a conductive plate having the sensor plane that extends "laterally" along or in parallel to the main surface of the semiconductor chip. Since the sensitivity axis of the sensor element of the lateral Hall sensor is perpendicular to the sensor plane, this generally means that the sensor element of the lateral Hall sensor is sensitive to magnetic fields vertical, or out-of-plane, to the main surface of the semiconductor chip. For the sensor element of the lateral Hall sensor, a voltage value is output according to the magnetic field flux density in the direction of its sensitivity axis.

Magnetoresistive sensor elements and vertical Hall sensor elements may be used to measure magnetic fields parallel to the chip plane and lateral Hall sensor elements may be used to measure magnetic fields perpendicular to the chip plane. Two or more sensor elements and corresponding sensor circuitry may be accommodated (e.g., integrated) in a same semiconductor chip. The sensor circuitry may be referred to as a signal processing circuit and/or a signal conditioning circuit that receives one or more signals (e.g., sensor signals) from one or more sensor elements in the form of raw measurement data and derives, from the one or more signals, a measurement signal that represents the magnetic field. In some cases, the sensor circuitry may generate a differential measurement signal from the signals generated by two sensor elements having a same sensing axis (e.g., two sensor elements sensitive to a same magnetic field component) using differential calculus. A differential measurement signal provides robustness to homogenous external stray magnetic fields.

Signal conditioning, as used herein, refers to manipulating an analog signal in such a way that the signal meets requirements of a next stage for further processing. Signal conditioning may include converting from analog to digital (e.g., via an analog-to-digital converter), amplification, filtering, converting, biasing, range matching, isolation, or any other processes used to make a sensor output suitable for processing after conditioning.

Thus, the sensor circuitry may include an analog-to-digital converter (ADC) that converts the analog signal from the one or more sensor elements to a digital signal. The sensor circuitry may also include a digital signal processor (DSP) that performs some processing on the digital signal. Therefore, the semiconductor chip, which may also be referred to as an integrated circuit (IC), may include a circuit that conditions and amplifies the sensor signal of one or more sensor elements via signal processing and/or conditioning.

A system may include a current-carrying conductor that carries a current to be measured. A magnetic field sensor detects a magnetic field created by the current and generates a sensor signal proportional to the magnetic field. Thus, the sensor signal is a measure for the current. If the current-carrying conductor is integrated within a sensor component (e.g., a sensor package that houses the magnetic field sensor), the current-carrying conductor is referred to as an internal current rail of the sensor component. In contrast, if the current-carrying conductor is not integrated within the sensor component (e.g., the sensor package that houses the magnetic field sensor), the current-carrying conductor is referred to as an external current rail of the sensor component. A magnetic field distribution of the magnetic field should be considered for an internal current rail configuration and an external current rail configuration in order to provide accurate sensing of the magnetic field by the magnetic field sensor.

When the current-carrying conductor is the internal current rail of the sensor component, the current is directed through the sensor component. The current-carrying conductor may be part of a lead frame or another kind of substrate of the sensor component. The current-carrying conductor is structured within the sensor component such that the current-carrying conductor carries the current past or at least proximate to the magnetic field sensor. The current-carrying conductor may be shaped in a specific way in order to create the magnetic field distribution at a sensor location of a sensor element of the magnetic field sensor that optimizes sensing accuracy. For example, the current-carrying conductor may be narrowed in an area proximate to the sensor location in order to increase the magnetic field flux density of the magnetic field at the sensor location. This narrowing of the current-carrying conductor enables higher sensing accuracy at the sensor location but results in higher resistance of the current-carrying conductor and can limit an amount of current that the current-carrying conductor can be used to carry (e.g., due to overheating). The higher resistance leads to undesired higher power losses and higher temperatures within the sensor component that can cause issues with overheating.

However, design rules of a chip package limit a design of the current-carrying conductor used as the internal current rail, which limits a shaping of the magnetic field distribution and limits sensor locations at which the sensor elements can be placed within the chip package. In addition, distances between the sensor elements can depend on a shape of the magnetic field distribution and an arrangement of chip components within the chip package, where a larger distance between the sensor elements causes the magnetic field sensor to have a larger chip size. A larger chip size typically increases manufacturing costs by increasing an amount of material used to manufacture the chip and by increasing a size of a system in which the chip is implemented.

Similarly, a configuration of the external current rail can affect the shaping of the magnetic field distribution, which can limit the sensor locations at which the sensor elements can be placed within the system. By limiting the sensor locations, the shape of the magnetic field distribution can lead to increased chip sizes of the magnetic field sensor and increased sizes of the system in which the magnetic field sensor is implemented.

In addition, unwanted stray magnetic fields may be generated by another magnetic field source, such as another current-carrying conductor located in a vicinity of the magnetic field sensor. The unwanted stray magnetic fields can negatively affect an accuracy of a measurement of a current-carrying conductor of interest that is performed by the magnetic field sensor.

Accordingly, some implementations disclosed herein are directed to shaping a magnetic field distribution of a magnetic field that optimizes sensing accuracy of sensor elements of a magnetic field sensor while enabling a reduction in a chip size of the magnetic field sensor. In addition, some implementations disclosed herein, provide a current-carrying conductor that is shaped to increase a magnetic field flux density at one or more sensor locations to improve sensing accuracy without introducing undesired higher power losses and temperature increases that result from narrowing a shape of the current-carrying conductor. Additionally, some implementations disclosed herein provide higher current carrying capabilities of the current-carrying conductor and smaller chip sizes, which increases a number of use cases, prevents overheating, and reduces manufacturing costs.

Some implementations disclosed herein are directed to shaping the magnetic field distribution to be robust against and suppress unwanted stray magnetic fields. A suppression of unwanted stray magnetic fields leads to higher accuracy of magnetic field measurements acquired by the magnetic field sensor. For example, in some implementations disclosed herein, at least two sensor elements may be used to compensate for homogeneous stray magnetic fields via differential sensing. In some implementations disclosed herein, a geometry of the current-carrying conductor may be shaped to ensure that a first sensor element of the magnetic field sensor receives a positive magnetic field of the current and a second sensor element of the magnetic field sensor receives a negative magnetic field of the current. In other words, the first sensor element and the second sensor element are positioned such that first sensor element and the second sensor element measure a same magnetic field, but with different signs (e.g., the first sensor element and the second sensor element measure a differential magnetic field). Subtracting a sensor signal generated by the first sensor element from a sensor signal generated by the second sensor eliminates any homogeneous stray magnetic fields added to the magnetic field to be sensed. Accordingly, in some implementations disclosed herein, the geometry of the current-carrying conductor may be configured to shape the magnetic field distribution to not only suppress unwanted homogeneous stray magnetic fields but to enable differential sensing using two or more sensor elements. In addition, in some implementations disclosed herein, the geometry of the current-carrying conductor is shaped to increase the magnetic field flux density at the sensor locations the first sensor element and the second sensor element to improve sensing accuracy without introducing the undesired higher power losses and temperature increases that result from narrowing the shape of the current-carrying conductor.

In addition, some implementations disclosed herein are directed to redundant current sensing that provides multiple sensor elements or multiple sets of sensor elements to perform multiple measurements along a current path of the current-carrying conductor. For example, two sets of sensor elements can be provided along the current path of the current-carrying conductor to enable an acquisition of two differential sensing measurements. The two differential sensing measurements can be cross-checked against each other to ensure both sets of sensor elements are operating normally. In addition, if is determined that one of the two sets of sensor elements has failed, the other set of sensor elements can take over. Accordingly, some implementations disclosed herein are directed to shaping the geometry of the current-carrying conductor in a way that the shape of the magnetic field distribution suppresses unwanted homogeneous stray magnetic fields at the sensor locations of the sensor elements, enhances the accuracy at the sensor locations of the sensor elements (e.g., by optimizing the magnetic field flux density at the sensor locations to create a sufficiently high magnetic field at the sensor locations), and/or enables redundant differential sensing using at least two sets of sensor elements.

Figure 1B:
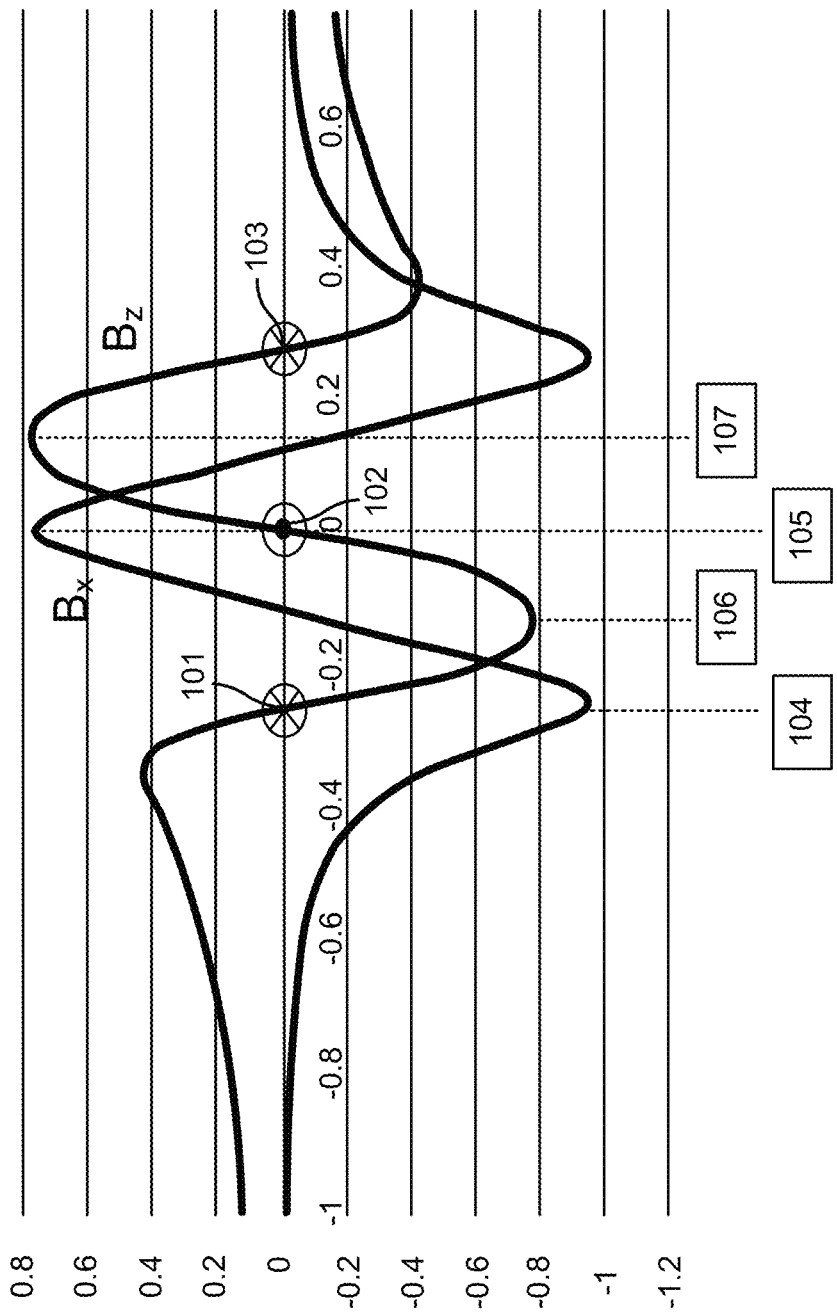

FIGS. 1A and 1B illustrate a magnetic field shaping principle according to one or more implementations. FIG. 1A illustrates three conductor structures, including a first conductor structure 101, a second conductor structure 102, and a third conductor structure 103. In the examples that follow, a chip plane of a magnetic field sensor is defined by an x-axis and a y-axis (e.g., an x-y plane). A z-axis perpendicularly bisects the chip plane. Accordingly, an x-direction and a y-direction are considered to extend "in-plane" (e.g., parallel) to the chip plane and a z-direction is considered to extend "out-of-plane" (e.g., perpendicular) to the chip plane. The first conductor structure 101, the second conductor structure 102, and the third conductor structure 103 extend along the y-axis, parallel to the chip plane. The first conductor structure 101, the second conductor structure 102, and the third conductor structure 103 also extend parallel to each other.

While electrical connections are not illustrated in FIG. 1A, the first conductor structure 101, the second conductor structure 102, and the third conductor structure 103 are electrically connected to each other (e.g., in series) to carry a current I to be measured. For example, the second conductor structure 102 may be electrically coupled to and between the first conductor structure 101 and the third conductor structure 103 such that the current I flows from the first conductor structure 101 to the third conductor structure 103 via the second conductor structure 102. In this example, a cross (X) represents the current I flowing into the page and a dot (●) represents the current I flowing out of the page. Accordingly, the current I alternates flowing directions as the current I sequentially flows through the first conductor structure 101, the second conductor structure 102, and the third conductor structure 103. For example, the current I may flow in a negative y-direction through the first conductor structure 101, the current I may flow in a positive y-direction through the second conductor structure 102, and the current I may flow again in the negative y-direction through the third conductor structure 103. In other words, the current I is carried either parallel or antiparallel to the y-direction as the current I flows through the first conductor structure 101, the second conductor structure 102, and the third conductor structure 103.

The first conductor structure 101 produces a first magnetic field B1 based on the current I flowing therethrough. The first magnetic field B1 has both lateral and perpendicular magnetic field components that are both perpendicular to a direction of a current flow of the current I. Since the current I flows parallel or antiparallel to the y-direction, a lateral magnetic field component (e.g., an in-plane magnetic field component) of the first magnetic field B1 is an x-magnetic field component Bx that is aligned parallel to the x-axis and a perpendicular magnetic field component (e.g., an out-of-plane magnetic field component) of the first magnetic field B1 is a z-magnetic field component Bz that is aligned parallel to the z-axis.

Similarly, the second conductor structure 102 produces a second magnetic field B2 based on the current I flowing therethrough. The second magnetic field B2 has an x-magnetic field component Bx that is aligned parallel to the x-axis and a z-magnetic field component Bz that is aligned parallel to the z-axis.

Similarly, the third conductor structure 103 produces a third magnetic field B3 based on the current I flowing therethrough. The third magnetic field B3 has an x-magnetic field component Bx that is aligned parallel to the x-axis and a z-magnetic field component Bz that is aligned parallel to the z-axis.

It is noted that a field orientation of the second magnetic field B2 is opposite to both a field orientation of the first magnetic field B1 and a field orientation of the third magnetic field B3 because the current I flows in an opposite direction when the current I flows through the second conductor structure 102. In contrast, the field orientation of the first magnetic field B1 and the field orientation of the third magnetic field B3 are the same because the current I flows in a same direction when the current I flows through the first conductor structure 101 and the third conductor structure 103.

The first magnetic field B1, the second magnetic field B2, and the third magnetic field B3 combine to produce a first magnetic field distribution of the x-magnetic field component Bx and combine to produce a second magnetic field distribution of the z-magnetic field component Bz. In other words, the x-magnetic field components Bx of the first magnetic field B1, the second magnetic field B2, and the third magnetic field B3 combine to produce the first magnetic field distribution of the x-magnetic field component Bx. Likewise, the z-magnetic field components Bz of the first magnetic field B1, the second magnetic field B2, and the third magnetic field B3 combine to produce the second magnetic field distribution of the z-magnetic field component Bz.

FIG. 1B illustrates the first magnetic field distribution of the x-magnetic field component Bx and the second magnetic field distribution of the z-magnetic field component Bz. Due to the interaction of the x-magnetic field components Bx of the first magnetic field B1, the second magnetic field B2, and the third magnetic field B3, the first magnetic field distribution of the x-magnetic field component Bx is shaped in a way that optimizes measurement accuracy and suppression of homogenous stray magnetic fields at a first sensor location 104 and a second sensor location 105. A local minimum (e.g., a first extremum or negative peak) of the first magnetic field distribution of the x-magnetic field component Bx exists at the first sensor location 104 and a local maximum (e.g., a second extremum or positive peak) of the first magnetic field distribution of the x-magnetic field component Bx exists at the second sensor location 105. Therefore, a current sensor system can take advantage of peak magnetic field flux densities at the first sensor location 104 and the second sensor location 105 by providing a first sensor element that is sensitive to the x-magnetic field component Bx at the first sensor location 104 and by providing a second sensor element that is sensitive to the x-magnetic field component Bx at the second sensor location 105. As described above, the sensor elements that are sensitive to the x-magnetic field component Bx include xMR sensor elements and vertical Hall sensor elements. Additionally, the xMR sensor elements and the vertical Hall sensor elements are insensitive to the z-magnetic field component Bz.

Moreover, because the first extremum of the first magnetic field distribution is a negative peak and the second extremum of the first magnetic field distribution is a positive peak, a differential measurement can be acquired with a first sensor element and a second sensor element placed at the first sensor location 104 and the second sensor location 105, respectively, to cancel out any homogenous stray magnetic fields.

Likewise, due to the interaction of the z-magnetic field components Bz of the first magnetic field B1, the second magnetic field B2, and the third magnetic field B3, the second magnetic field distribution of the z-magnetic field component Bz is shaped in a way that optimizes measurement accuracy and suppression of homogenous stray magnetic fields at a third sensor location 106 and a fourth sensor location 107. A local minimum (e.g., a first extremum or negative peak) of the second magnetic field distribution of the z-magnetic field component Bz exists at the third sensor location 106 and a local maximum (e.g., a second extremum or positive peak) of the second magnetic field distribution of the z-magnetic field component Bz exists at the fourth sensor location 107. Therefore, the current sensor system can take advantage of peak magnetic field flux densities at the third sensor location 106 and the fourth sensor location 107 by providing a third sensor element that is sensitive to the z-magnetic field component Bz at the third sensor location 106 and by providing a fourth sensor element that is sensitive to the z-magnetic field component Bz at the fourth sensor location 107. As described above, the sensor elements that are sensitive to the z-magnetic field component Bz include lateral Hall sensor elements. Additionally, the lateral Hall sensor elements are insensitive to the x-magnetic field component Bx.

Moreover, because the first extremum of the second magnetic field distribution is a negative peak and the second extremum of the second magnetic field distribution is a positive peak, a differential measurement can be acquired with a third sensor element and a fourth sensor element placed at the third sensor location 106 and the fourth sensor location 107, respectively, to cancel out any homogenous stray magnetic fields.

Additionally, in some implementations, measurements of the x-magnetic field component Bx and the z-magnetic field component Bz, both representative of a measure of a single current, can be obtained independently by redundant sets of sensor elements to ensure accuracy and normal operability of a current sensor system.

As indicated above, FIGS. 1A and 1B are provided merely as examples. Other examples are possible and may differ from what was described with regard to FIGS. 1A and 1B. For example, in some implementations, a current flow may be reversed without deviating from the disclosure provided herein. In some implementations, a shape of the first magnetic field distribution of the x-magnetic field component Bx may differ from the shape shown in FIG. 1B. In some implementations, a shape of the second magnetic field distribution of the z-magnetic field component Bz may differ from the shape shown in FIG. 1B. In some implementations, the first conductor structure 101, the second conductor structure, and the third conductor structure 103 may be oriented along a different axis and, thus, an orientation of the first conductor structure 101, the second conductor structure 102, and the third conductor structure 103 may differ from an orientation shown in FIG. 1A.

Figure 2A:
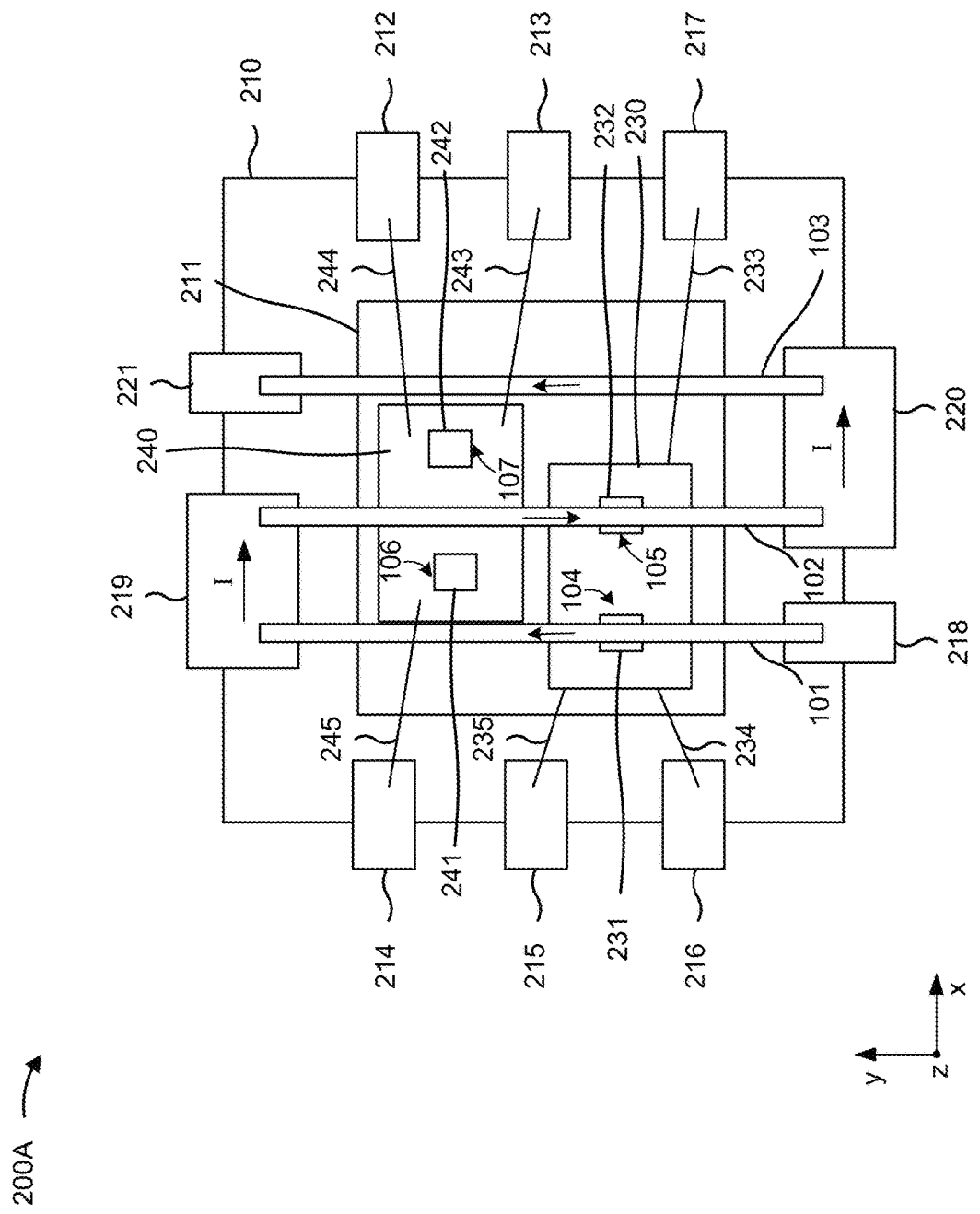
FIGS. 2A-2C illustrate a current sensor system according to one or more implementations.
Figure 2B:
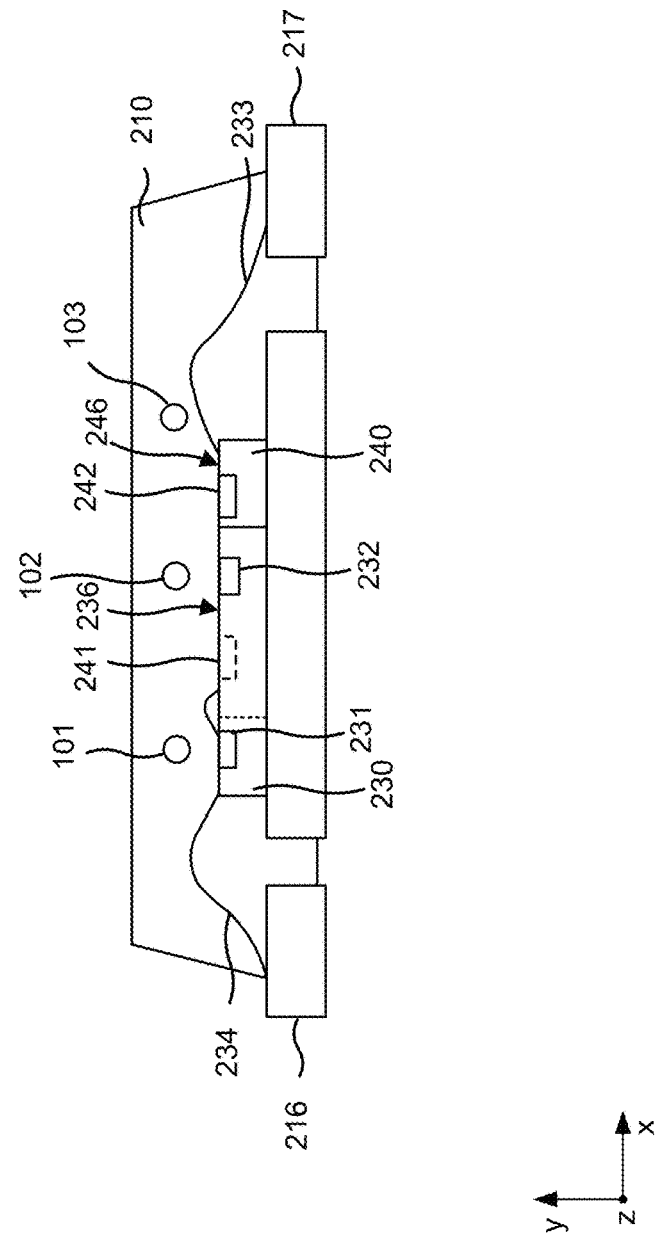
Figure 2C:
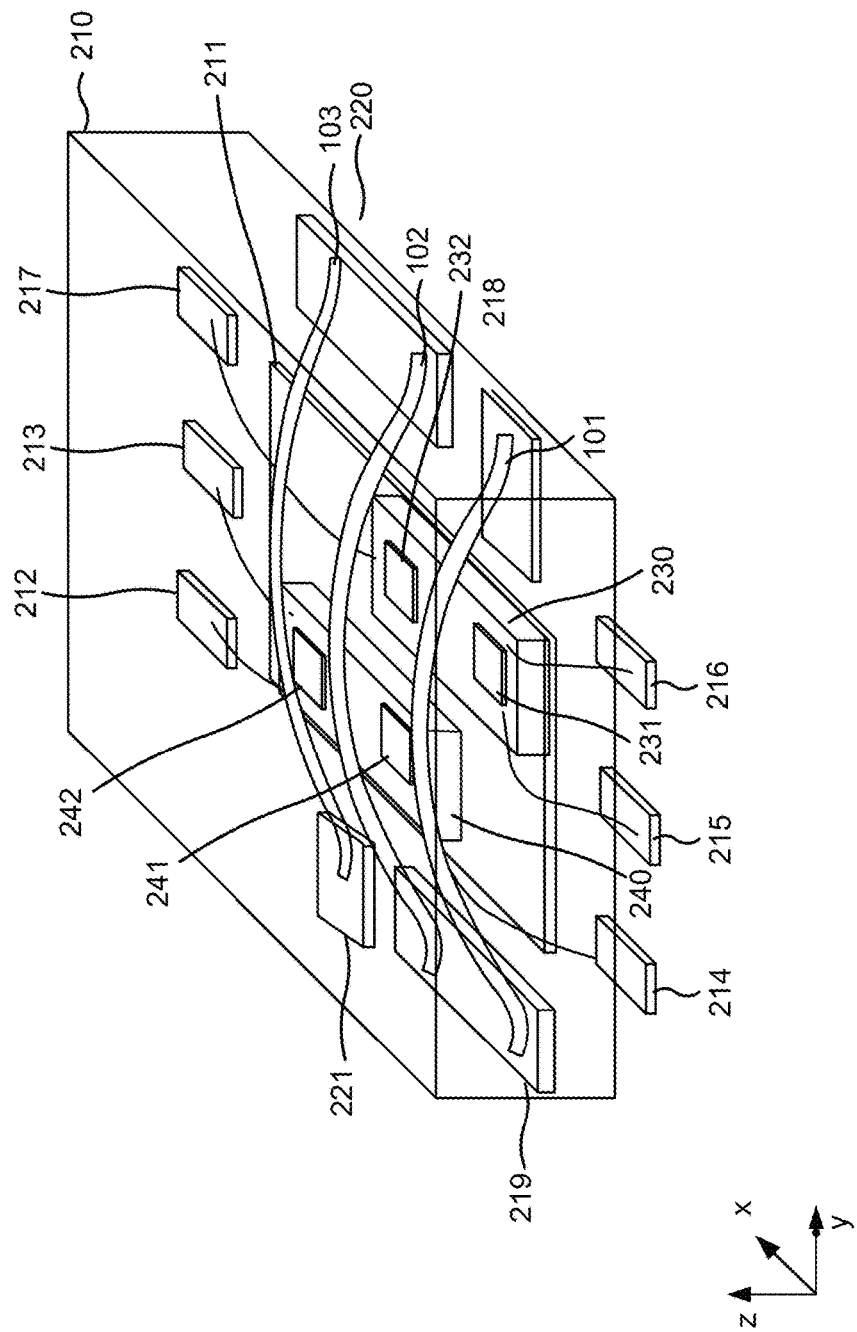

FIGS. 2A-2C illustrate a current sensor system 200 according to one or more implementations. In particular, FIG. 2A illustrates a top view of the current sensor system 200, FIG. 2B illustrates a cross-section view of the current sensor system 200, and FIG. 2C illustrates a perspective view of the current sensor system 200. The current sensor system 200 includes the first conductor structure 101, the second conductor structure 102, and the third conductor structure 103 that extend parallel to each other and in parallel to the y-axis. The first conductor structure 101, the second conductor structure 102, and the third conductor structure 103 are laterally spaced apart in the x-direction.

The current sensor system 200 may include a chip package (e.g., a sensor package) that includes a lead frame and a housing 210, such as a mold compound or other encapsulant. The lead frame may include a die pad 211 and conductive interconnect structures 212-221. The conductive interconnect structures 212-221 may be leads or conductive pads (e.g., bond pads). In this example, the first conductor structure 101, the second conductor structure 102, and the third conductor structure 103 may be wire bond interconnects, or simply, bond wires. The first conductor structure 101, the second conductor structure 102, and the third conductor structure 103 are integrated within the chip package. Therefore, a conductive path formed by the first conductor structure 101, the second conductor structure 102, and the third conductor structure 103 is an internal current rail of the current sensor system 200. The housing 210 not only protects internal components of the current sensor system 200 from an external environment, but the housing 210 also provides electrical isolation between the internal components of the current sensor system 200.

The current sensor system 200 includes a first magnetic field sensor 230 (e.g., a first sensor chip) arranged on the did pad 211. The first magnetic field sensor 230 includes a first sensor element 231 arranged at the first sensor location 104 and a second sensor element 232 arranged at the second sensor location 105. The first sensor location 104 overlaps with the first conductor structure 101 in the z-direction and the second sensor location 105 overlaps with the second conductor structure 102 in the z-direction in accordance with the shape of the first magnetic field distribution.

The first magnetic field sensor 230 also includes a main surface 236 (e.g., an upper surface) at which the first sensor element 231 and the second sensor element 232 are arranged. The main surface 236, shown in FIG. 2B, defines a chip plane of the first magnetic field sensor 230 (e.g., an x-y plane). The first sensor element 231 is configured to generate a first sensor signal based on measuring the x-magnetic field component Bx of the magnetic field produced by the current I and the second sensor element 232 is configured to generate a second sensor signal based on measuring the x-magnetic field component Bx of the magnetic field produced by the current I.

The current sensor system 200 further includes bond wires 233-235 that electrically connect the first magnetic field sensor 230 to the conductive interconnect structures 215-217. The conductive interconnect structure 215 may provide a first supply potential (e.g., a positive supply potential VCC) to the first magnetic field sensor 230 and the conductive interconnect structure 216 may provide a second supply potential (e.g., ground GND) to the first magnetic field sensor 230. The conductive interconnect structure 217 may receive a first differential measurement signal from the first magnetic field sensor 230 for output from the current sensor system 200. The first differential measurement signal may be generated by a first sensor circuit of the first magnetic field sensor 230. For example, the first sensor circuit may subtract the first sensor signal generated by the first sensor element 231 from the second sensor signal generated by the second sensor element 232, or vice versa, to generate the first differential measurement signal.

The current sensor system 200 includes a second magnetic field sensor 240 (e.g., a second sensor chip) arranged on the did pad 211. The second magnetic field sensor 240 includes a third sensor element 241 arranged at the third sensor location 106 and a fourth sensor element 242 arranged at the fourth sensor location 107. The third sensor location 106 is located between the first conductor structure 101 and the second conductor structure 102 in the x-direction in accordance with the shape of the second magnetic field distribution. The fourth sensor location 107 is located between the second conductor structure 102 and the third conductor structure 103 in the x-direction in accordance with the shape of the second magnetic field distribution.

The second magnetic field sensor 240 also includes a main surface 246 (e.g., an upper surface) at which the third sensor element 241 and the fourth sensor element 242 are arranged. The main surface 246, shown in FIG. 2B, defines a chip plane of the second magnetic field sensor 240 (e.g., an x-y plane). The third sensor element 241 is configured to generate a third sensor signal based on measuring the z-magnetic field component Bz of the magnetic field produced by the current I and the fourth sensor element 242 is configured to generate a fourth sensor signal based on measuring the z-magnetic field component Bz of the magnetic field produced by the current I.

The current sensor system 200 further includes bond wires 243-245 that electrically connect the second magnetic field sensor 240 to the conductive interconnect structures 212-214. The conductive interconnect structure 212 may provide the first supply potential (e.g., the positive supply potential VCC) to the second magnetic field sensor 240 and the conductive interconnect structure 213 may provide the second supply potential (e.g., ground GND) to the second magnetic field sensor 240. The conductive interconnect structure 214 may receive a second differential measurement signal from the second magnetic field sensor 240 for output. The second differential measurement signal may be generated by a second sensor circuit of the second magnetic field sensor 240. For example, the second sensor circuit may subtract the third sensor signal generated by the third sensor element 241 from the fourth sensor signal generated by the fourth sensor element 242, or vice versa, to generate the second differential measurement signal.

In order to generate the first magnetic field distribution of the x-magnetic field component Bx and the second magnetic field distribution of the z-magnetic field component Bz as shown in FIG. 1B, the conductive interconnect structure 218 may be configured as a current input for the current I and the conductive interconnect structure 221 may be configured as a current output for the current I. The current I may enter the current sensor system 200 at the conductive interconnect structure 218, where the current I is provided to the first conductor structure 101. The current I may continue to flow through the first conductor structure 101 to the conductive interconnect structure 219. The conductive interconnect structure 219 may be a bond pad that electrically connects the first conductor structure 101 to the second conductor structure 102 in order to provide the current I from the first conductor structure 101 to the second conductor structure 102. The current I may continue to flow through the second conductor structure 102 to the conductive interconnect structure 220. The conductive interconnect structure 220 may be a bond pad that electrically connects the second conductor structure 102 to the third conductor structure 103 in order to provide the current I from the second conductor structure 102 to the third conductor structure 103. The current I may continue to flow through the third conductor structure 103 to the conductive interconnect structure 221. The conductive interconnect structure 221 may be a current output of the current sensor system 200 where the current I exits the current sensor system 200.

Accordingly, the first conductor structure 101 traverses a first part of the current sensor system 200 in the y-direction to carry the current I parallel to the y-direction, the second conductor structure 102 traverses a second part of the current sensor system 200 in the y-direction to carry the current I antiparallel to the y-direction, and the third conductor structure 103 traverses a third part of the current sensor system 200 in the y-direction to carry the current I parallel to the y-direction. The conductive interconnect structures 218-221 are arranged such that the current I flows in an "S" pattern through the current sensor system 200 to produce the first magnetic field distribution and the second magnetic field distribution.

The first sensor element 231 (e.g., an xMR sensor element or a vertical Hall-effect sensor element) is arranged at a first extremum of the first magnetic field distribution of the x-magnetic field component Bx, the second sensor element 232 (e.g., an xMR sensor element or a vertical Hall-effect sensor element) is arranged at a second extremum of the first magnetic field distribution of the x-magnetic field component Bx, the third sensor element 241 (e.g., a lateral Hall-effect sensor element) is arranged at a first extremum of the second magnetic field distribution of the z-magnetic field component Bz, and the fourth sensor element 242 (e.g., a lateral Hall-effect sensor element) is arranged at a second extremum of the second magnetic field distribution of the z-magnetic field component Bz.

Additionally, the first sensor element 231 and the second sensor element 232 are arranged at the first sensor location 104 and the second sensor location 105, respectively, at which the second magnetic field distribution of the z-magnetic field component Bz is zero, or substantially zero, and the third sensor element 241 and the fourth sensor element 242 are arranged at the third sensor location 106 and the fourth sensor location 107 at which the first magnetic field distribution of the x-magnetic field component Bx is zero, or substantially zero. Accordingly, there is no, or substantially no, magnetic cross-talk between the x-magnetic field component Bx and the z-magnetic field component Bz at the first sensor location 104, the second sensor location 105, the third sensor location 106, and the fourth sensor location 107, which leads to less interference and aids in the accuracy of the magnetic field measurements.

The first sensor element 231 and the second sensor element 232 are used to generate the first differential measurement signal that is robust against homogenous stray magnetic fields. Similarly, the third sensor element 241 and the fourth sensor element 242 are used to generate the second differential measurement signal that is robust against homogenous stray magnetic fields. Moreover, two sets of sensor elements are used to measure the same current I. Thus, the operability of the first sensor element 231, the second sensor element 232, the third sensor element 241, and the fourth sensor element 242 can be monitored by monitoring individual sensor signals generated by the sensor elements 231, 232, 241, and 242 and/or monitoring the first differential measurement signal and the second differential measurement signal. For example, if the first differential measurement signal and the second differential measurement signal deviate from each other by more than a threshold, a fault can be detected. If a fault is detected, the current sensor system 200 can determine which set of the two sets of sensor elements is operating correctly and which set of the two sets of sensor elements is faulty, and use only the set of sensor elements that is operating correctly for a current sensing operation.

Thus, the current sensor system 200 provides redundant current sensing using two different sensor technologies (e.g., xMR and lateral Hall-effect or vertical Hall-effect and lateral Hall-effect). Using two different sensor technologies provides independent current sensing capabilities and provides increased resiliency against faults and external factors. For example, two different sensor technologies are less likely to be vulnerable to a same error. Furthermore, an external interference is less likely to affect both sets of sensor elements since one set of sensor elements is sensitive to an in-plane field component and insensitive to other magnetic field components, while the other set of sensor elements is sensitive to an out-of-plane field component and insensitive to other magnetic field components.

Moreover, a current path formed by the first conductor structure 101, the second conductor structure 102, the third conductor structure 103, the conductive interconnect structure 219, and the conductive interconnect structure 220 is not restricted by a narrowed current restriction region that increases power losses. Thus, a geometry of the current path is capable of providing detectable magnetic fields at the sensor locations 104-107 without introducing additional power losses. The first conductor structure 101, the second conductor structure 102, and the third conductor structure 103 provide magnetic field shaping of the first magnetic field distribution and the second magnetic field distribution on a minimum area of the current sensor system 200 (e.g., within a minimum area of the chip package). Accordingly, the chip package can be made smaller to decrease manufacturing cost while also achieving the above-described benefits, including increased accuracy and robustness against homogenous stray magnetic fields.

As indicated above, FIGS. 2A-2C are provided merely as examples. Other examples are possible and may differ from what was described with regard to FIGS. 2A-2C. For example, in some implementations, the first sensor element 231, the second sensor element 232, the third sensor element 241, and the fourth sensor element 242 may be integrated on a single magnetic field sensor (e.g., on a single chip). The first sensor location 104 may overlap with the second conductor structure 102 in the z-direction and the second sensor location 105 may overlap with the third conductor structure 103 in the z-direction. In some implementations, the chip package may include more or fewer leads than a quantity that is shown in FIGS. 2A-2C. In some implementations, a different type of conductive structure may be used for one or more of the first conductor structure 101, the second conductor structure 102, or the third conductor structure 103. In some implementations, a different type of conductive interconnect structure may be used for one or more of the conductive interconnect structures 218-221. In some implementations, the chip package may be a flip chip package that uses flip chip interconnects instead of bond wires 233-235 and 243-245. In some implementations, additional circuit components may be integrated within, or attached to, the current sensor system 200 without deviating from the disclosure provided above.

Figure 3:
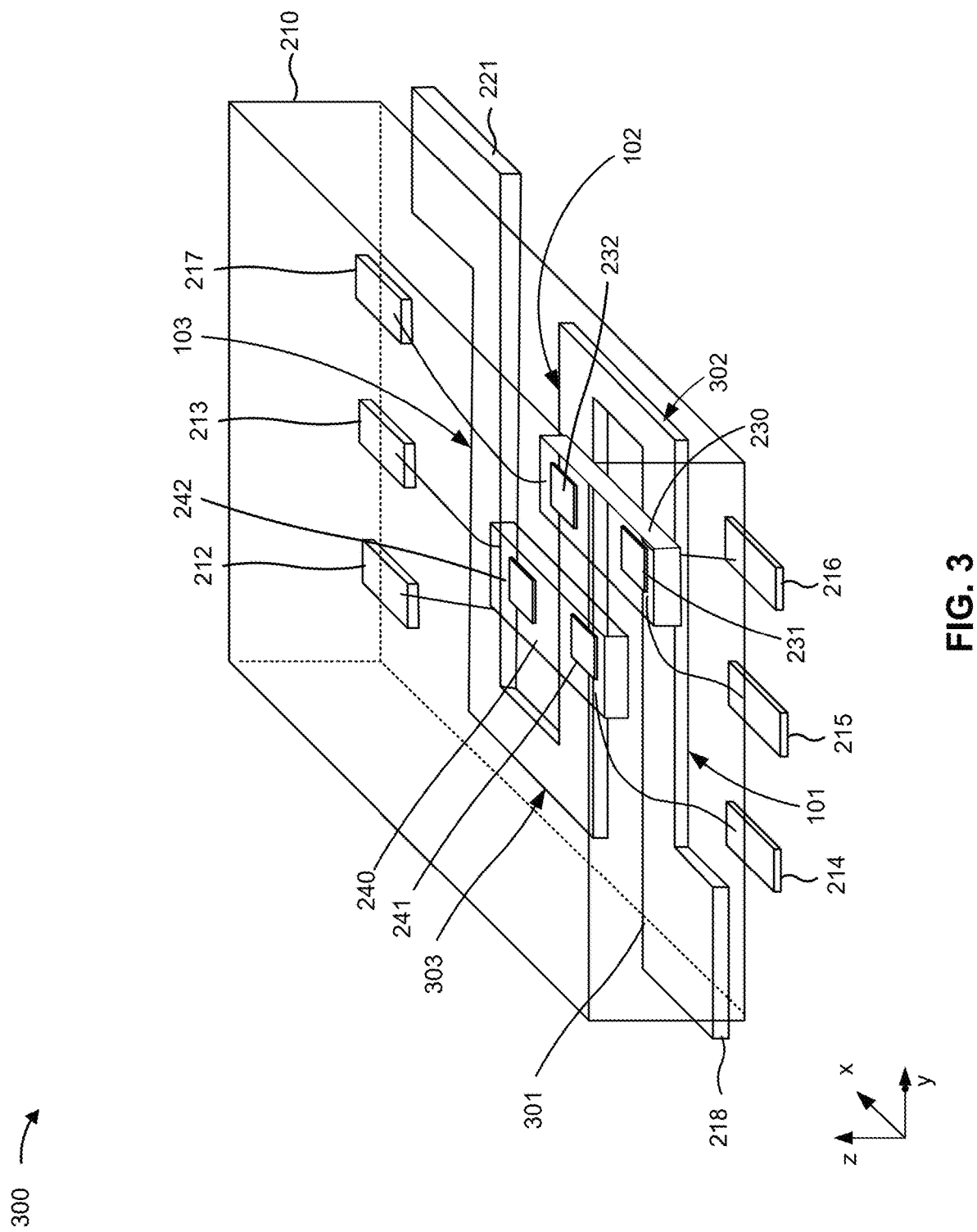
FIG. 3 illustrates a current sensor system according to one or more implementations.

FIG. 3 illustrates a current sensor system 300 according to one or more implementations. The current sensor system 300 is similar to current sensor system 200, with the exception that the current sensor system 300 includes a common conductor structure 301 comprising the first conductor structure 101, the second conductor structure 102, and the third conductor structure 103. As shown in FIG. 3, the common conductor structure 301 is a one-piece integral structure. The common conductor structure 301 may made of one or more conductor layers of a laminate substrate (e.g., printed circuit board (PCB)). The laminate substrate may be an organic-based substrate or a ceramic-based substrate. Alternatively, the common conductor structure 301 may be part of the lead frame of the chip package. In either case, the common conductor structure 301 is an internal current rail of the current sensor system 300. The first magnetic field sensor 230 and the second magnetic field sensor 240 may be arranged on the common conductor structure 301.

A geometry of the common conductor structure 301 has an "S" shape that meanders through the chip package of the current sensor system 300. The common conductor structure 301 includes interconnect segments 302 and 303 that extend in the x-direction, perpendicular to the first conductor structure 101, the second conductor structure 102, and the third conductor structure 103. The interconnect segment 302 is electrically connected to the first conductor structure 101 and the second conductor structure 102. The interconnect segment 303 is electrically connected to the second conductor structure 102 and the third conductor structure 103. The common conductor structure 301 routes the current I through the current sensor system 300 between the conductive interconnect structure 218 and the conductive interconnect structure 221. The conductive interconnect structure 218 and the conductive interconnect structure 221 may be part of the common conductor structure 301.

The number and arrangement of components shown in FIG. 3 are provided as an example. In practice, the current sensor system 300 may include additional components, fewer components, different components, or differently arranged components than those shown in FIG. 3. Two or more devices shown in FIG. 3 may be implemented within a single device, or a single device shown in FIG. 3 may be implemented as multiple, distributed devices. Additionally, or alternatively, a set of components (e.g., one or more components) of the current sensor system 300 may perform one or more functions described as being performed by another set of components of the current sensor system 300.

Figure 4:
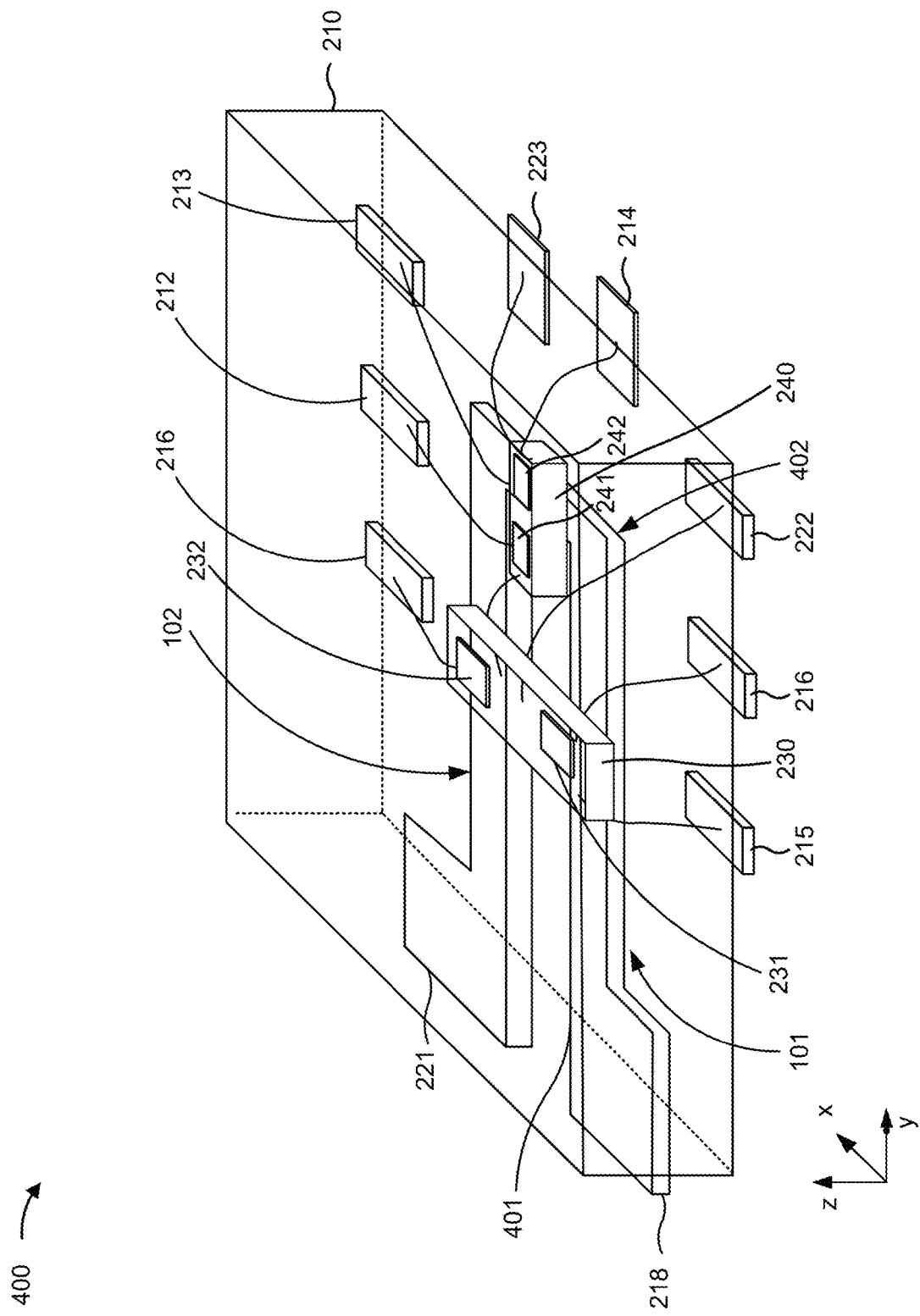
FIG. 4 illustrates a current sensor system according to one or more implementations.

FIG. 4 illustrates a current sensor system 400 according to one or more implementations. The current sensor system 400 may be a chip package with components similar to the components of the current sensor system 300. However, the current sensor system 400 includes a common conductor structure 401 having a "U" shape instead of the common conductor structure 301 having the "S" shape. The common conductor structure 401 may be part of a lead frame or a conductive route in a circuit substrate of the current sensor system 400. The common conductor structure 401 includes the first conductor structure 101 and the second conductor structure 102 that extend parallel to the y-axis. The common conductor structure 401 further includes an interconnect segment 402 as an additional conductor structure that extends parallel to the x-axis. The interconnect segment 402 is electrically connected to the first conductor structure 101 and the second conductor structure 102 to form a "U" shaped conductive path between the conductive interconnect structure 218 and the conductive interconnect structure 221.

Accordingly, the first conductor structure 101 traverses a first part of the current sensor system 400 in the y-direction such that the first conductor structure 101 carries the current I parallel to the y-direction. The interconnect segment 402 is electrically connected to the first conductor structure 101 such that the interconnect segment 402 traverses a second part of the current sensor system 400 in the x-direction to carry the current I parallel to the x-direction. The second conductor structure 102 is electrically connected to the interconnect segment 402 such that the second conductor structure traverses a third part of the current sensor system 400 in the y-direction. The second conductor structure 102 is configured to carry the current I antiparallel to the y-direction. The conductive interconnect structure 218, electrically connected to the first conductor structure 101, may be configured as the current input for the current I. The conductive interconnect structure 221, electrically connected to the second conductor structure 102, may be configured as the current output for the current I. The conductive interconnect structure 218 and the conductive interconnect structure 221 may be part of the common conductor structure 401.

The first conductor structure 101, the second conductor structure 102, and the interconnect segment 402 generate respective magnetic fields based on the current flowing therethrough. The first conductor structure 101 produces a first magnetic field having an x-magnetic field component Bx and a z-magnetic field component Bz, the second conductor structure 102 produces a second magnetic field having an x-magnetic field component –Bx and a z-magnetic field component –Bz, with a field orientation opposite to the first magnetic field. The interconnect segment 402 generates a third magnetic field having a y-magnetic field component By and a z-magnetic field component Bz.

The current sensor system 400 includes the first magnetic field sensor 230 (e.g., the first sensor chip) and the second magnetic field sensor 240 (e.g., the second sensor chip). The first magnetic field sensor 230 and the second magnetic field sensor 240 may be arranged on the common conductor structure 401. The first sensor element 231 overlaps with the first conductor structure 101 in the z-direction and the second sensor element 232 overlaps with the second conductor structure 102 in the z-direction. As a result, the first sensor element 231 is placed at the first extremum (e.g., a local minimum or negative peak) of the first magnetic field distribution of the x-magnetic field component Bx for measuring the x-magnetic field component Bx and the second sensor element 232 is placed at the second extremum (e.g., a local maximum or positive peak) of the first magnetic field distribution of the x-magnetic field component Bx for measuring the x-magnetic field component Bx.

The third sensor element 241 and the fourth sensor element 242 are arranged between the first conductor structure 101 and the second conductor structure 102 in the x-direction. Additionally, the third sensor element 241 and the fourth sensor element 242 are offset from the interconnect segment 402 in the y-direction. As a result, the third sensor element 241 is placed at the first extremum (e.g., a local minimum or negative peak) of the second magnetic field distribution of the z-magnetic field component Bz for measuring the z-magnetic field component Bz and the fourth sensor element 242 is placed at the second extremum (e.g., a local maximum or positive peak) of the second magnetic field distribution of the z-magnetic field component Bz for measuring the z-magnetic field component Bz.

The first magnetic field distribution of the x-magnetic field component Bx is shaped in a way that optimizes measurement accuracy and suppression of homogenous stray magnetic fields the first sensor element 231 and the second sensor element 232. The second magnetic field distribution of the z-magnetic field component Bz is shaped in a way that optimizes measurement accuracy and suppression of homogenous stray magnetic fields at the third sensor element 241 and the fourth sensor element 242.

Moreover, because the first extremum of the first magnetic field distribution is a negative peak and the second extremum of the first magnetic field distribution is a positive peak, a differential measurement can be acquired with the first sensor element 231 and the second sensor element 232 to cancel out any homogenous stray magnetic fields. Similarly, because the first extremum of the second magnetic field distribution is a negative peak and the second extremum of the second magnetic field distribution is a positive peak, a differential measurement can be acquired with the third sensor element 241 and the fourth sensor element 242 to cancel out any homogenous stray magnetic fields.

The current sensor system 400 further includes the conductive interconnect structures 212-217 and additional conductive interconnect structures 222 and 223 to provide supply potentials via bond wires to the first magnetic field sensor 230 and the second magnetic field sensor 240 and to receive sensor signals or differential measurement signals from the first magnetic field sensor 230 and the second magnetic field sensor 240 via one or more bond wires for output from the current sensor system 400.

The current sensor system 400 realizes similar benefits described above in conjunction with the current sensor system 200. For example, the current sensor system 400 provides redundant current sensing using two different sensor technologies (e.g., xMR and lateral Hall-effect or vertical Hall-effect and lateral Hall-effect). Using two different sensor technologies provides independent current sensing capabilities and provides increased resiliency against faults and external factors. For example, two different sensor technologies are less likely to be vulnerable to a same error. Furthermore, an external interference is less likely to affect both sets of sensor elements since one set of sensor elements is sensitive to an in-plane field component and insensitive to other magnetic field components, while the other set of sensor elements is sensitive to an out-of-plane field component and insensitive to other magnetic field components.

Moreover, a current path formed by the first conductor structure 101, the second conductor structure 102, and the interconnect segment 402 is not restricted by a narrowed current restriction region that increases power losses. Thus, a geometry of the current path is capable of providing detectable magnetic fields at the sensor locations 104-107 without introducing additional power losses. The first conductor structure 101, the second conductor structure 102, and the interconnect segment 402 provide magnetic field shaping of the first magnetic field distribution and the second magnetic field distribution on a minimum area of the current sensor system 400 (e.g., within a minimum area of the chip package). Accordingly, the chip package can be made smaller to decrease cost while also achieving the above-described benefits.

As indicated above, FIG. 4 is provided merely as an example. Other examples are possible and may differ from what was described with regard to FIG. 4. For example, in some implementations, the first sensor element 231, the second sensor element 232, the third sensor element 241, and the fourth sensor element 242 may be integrated on a single magnetic field sensor (e.g., on a single chip). In some implementations, the chip package may include more or fewer leads than a quantity that is shown in FIG. 4. In some implementations, a different type of conductive structure may be used for one or more of the first conductor structure 101, the second conductor structure 102, or the interconnect segment 402. In some implementations, the chip package may be a flip chip package that uses flip chip interconnects instead of bond wires. In some implementations, additional circuit components may be integrated within, or attached to, the current sensor system 400 without deviating from the disclosure provided above.

Figure 5A:
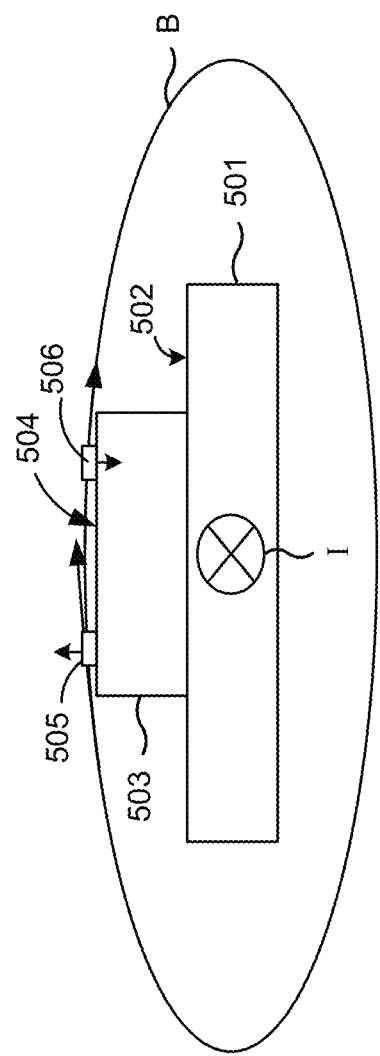
FIGS. 5A and 5B illustrate a magnetic sensing principle using a planar conductor according to one or more implementations.
Figure 5B:
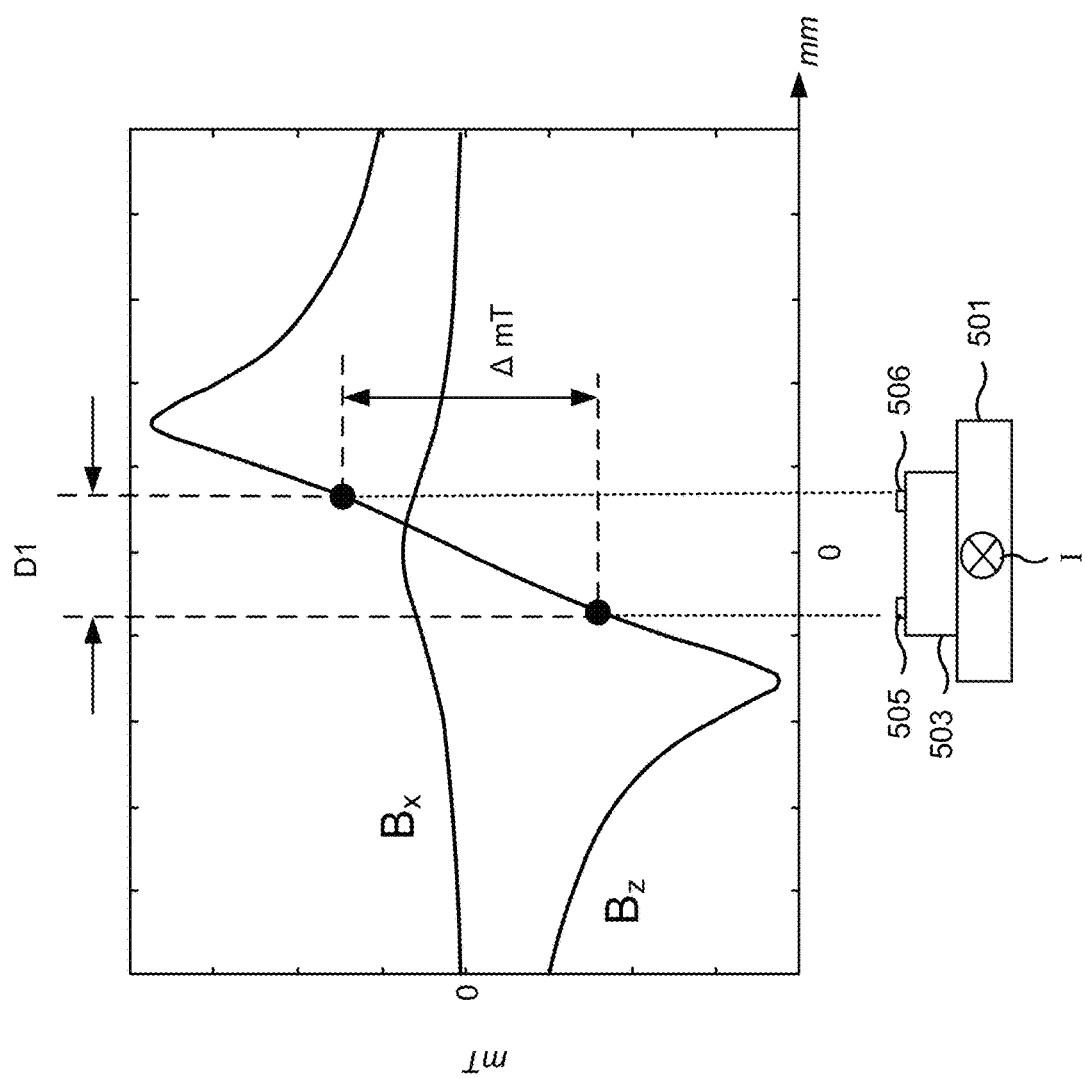

FIGS. 5A and 5B illustrate a magnetic sensing principle using a planar conductor 501 according to one or more implementations. The planar conductor 501 has a main surface 502 that extends laterally (e.g., horizontally) in parallel with an x-y plane. A magnetic field sensor 503 (e.g., a sensor chip) is arranged on or proximate to the planar conductor 501 and has a main surface 504 that extends laterally (e.g., horizontally) in parallel with the x-y plane. The magnetic field sensor 503 includes a first sensor element 505 and a second sensor element 506 that are sensitive to an out-of-plane magnetic field component (e.g., the z-magnetic field component Bz) of a magnetic field B. The current I produces the magnetic field B as the current I flows through the planar conductor 501. In order to perform differential sensing to cancel out any homogenous stray magnetic fields, the first sensor element 505 may be placed in a negative value of the magnetic field B and the second sensor element 506 may be placed in a positive value of the magnetic field B, or vice versa. In other words, a differential magnetic field is produced at the sensor locations of the first sensor element 505 and the second sensor element 506. Thus, the first sensor element 505 and the second sensor element 506 measure a same magnetic field, but with different signs. In order for the first sensor element 505 and the second sensor element 506 to measure a same magnetic field, but with different signs, the first sensor element 505 and the second sensor element 506 may be placed a certain lateral distance apart.

As shown in FIG. 5B, the first sensor element 505 and the second sensor element 506 are separated by a lateral distance D1 (e.g., 1.6 millimeters). The z-magnetic field component Bz has a magnetic field difference of Δ milliteslas (mT) (e.g., 6 mT) between sensor locations of the first sensor element 505 and the second sensor element 506. The value of the magnetic field difference ΔmT is sufficient for a sensor circuit of the magnetic field sensor 503 to acquire accurate measurements of the magnetic field B at the first sensor element 505 and at the second sensor element 506 and to enable stray field compensation by the differential sensing. In this example, the lateral distance D1 represents a minimum distance that provides the magnetic field difference ΔmT that is sufficient for accurate measurements of the magnetic field B at the first sensor element 505 and at the second sensor element 506. Thus, shrinking a lateral chip dimension of the magnetic field sensor 503 is limited by the lateral distance D1. Larger chip sizes result in higher manufacturing costs and can limit a placement of a chip within a system or limit a placement of components around the chip, which negatively impacts system design flexibility. Thus, it is beneficial to shrink the chip size of a chip to decrease manufacturing costs and increase system design flexibility. Meanwhile, a sufficient magnetic field difference between sensor elements can be maintained to ensure accurate measurements and stray field compensation.

Figure 5C:
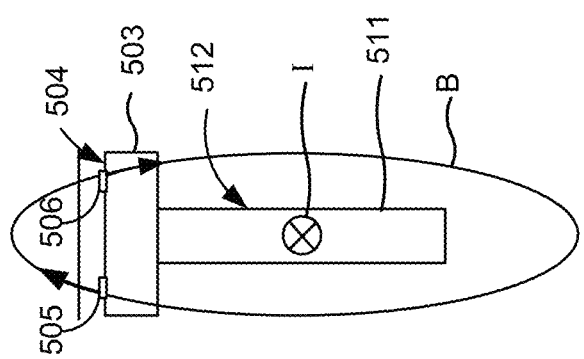
Figure 5C:
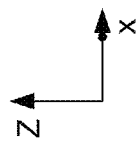

FIGS. 5C and 5D illustrate a magnetic sensing principle using a vertical conductor 511 according to one or more implementations. The vertical conductor 511 has a main surface 512 that extends vertically in parallel with a y-z plane. The magnetic field sensor 503 (e.g., the sensor chip) is arranged on or proximate to the vertical conductor 511 and has the main surface 504 that extends laterally (e.g., horizontally) in parallel with the x-y plane. Accordingly, an orientation of the vertical conductor 511 is rotated 90° relative to the main surface 504 when compared to an orientation of the planar conductor 501.

The current I produces a magnetic field B as the current I flows through the vertical conductor 511. A field orientation of the magnetic field B produced by the vertical conductor 511 is also rotated 90° relative to the main surface 504 when compared to a field orientation of the magnetic field B produced by the planar conductor 501. In particular, in FIG. 5C, a narrow portion of the magnetic field B is incident on the magnetic field sensor 503 at a steeper angle when compared with the magnetic field B as shown in FIG. 5A. As a result of the magnetic field B being more narrow in FIG. 5C, the sensor locations of the first sensor element 505 and the second sensor element 506 can be brought closer together. Additionally, as a result of the magnetic field B being incident on the magnetic field sensor 503 at the steeper angle in FIG. 5C, a magnetic field flux density of sufficient magnitude for accurate sensing can be provided to the first sensor element 505 and the second sensor element 506. In other words, the lateral distance between the first sensor element 505 and the second sensor element 506 can be reduced, reducing the chip size, while providing the differential magnetic field at the sensor locations that has the same magnetic field difference ΔmT as provided in FIG. 5A.

As shown in FIG. 5D, the first sensor element 505 and the second sensor element 506 are separated by a lateral distance D2 (e.g., 0.6 millimeters), which is smaller than the lateral distance D1. The z-magnetic field component Bz has the magnetic field difference ΔmT (e.g., 6 mT) between the sensor locations of the first sensor element 505 and the second sensor element 506. The lateral distance D2 represents a minimum distance in this arrangement that provides the magnetic field difference ΔmT that is sufficient for accurate measurements of the magnetic field B at the first sensor element 505 and at the second sensor element 506. Accordingly, a vertical orientation of the vertical conductor 511 enables a reduction in the lateral distance between the first sensor element 505 and the second sensor element 506, which leads to a reduction in a chip size of the magnetic field sensor 503. Meanwhile, despite the reduction in the lateral distance, the same magnetic field difference ΔmT is achieved, which provides accurate measurements and enables stray field compensation.

As indicated above, FIGS. 5A-5D are provided merely as examples. Other examples are possible and may differ from what was described with regard to FIGS. 5A-5D. For example, any value in distance, dimension, or milliteslas is intended merely as an example, for illustrative purposes, and the implementations described herein are not limited to any particular value or range in values.

Figure 6A:
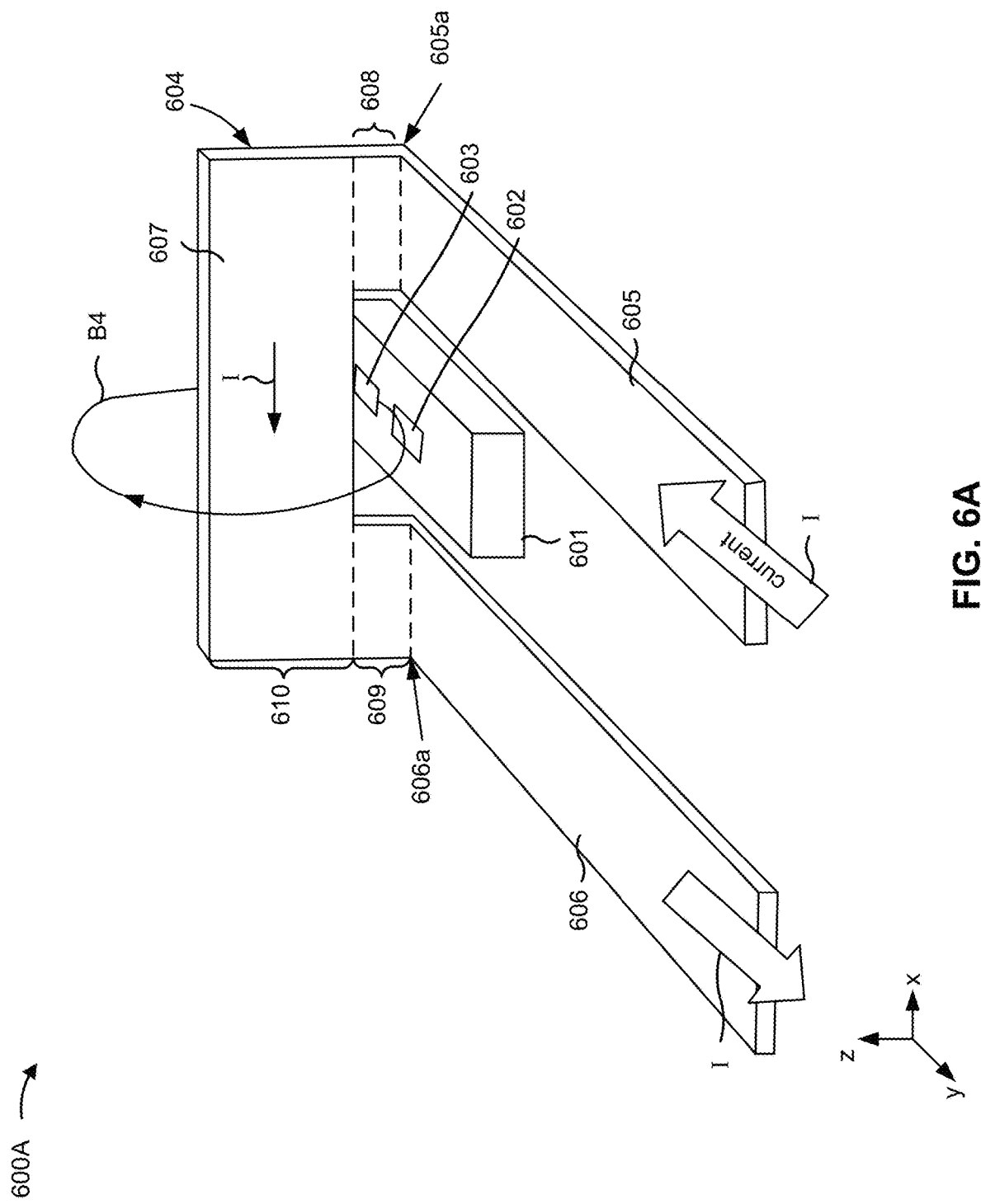
FIG. 6A illustrates a current sensor system according to one or more implementations.
Figure 6B:
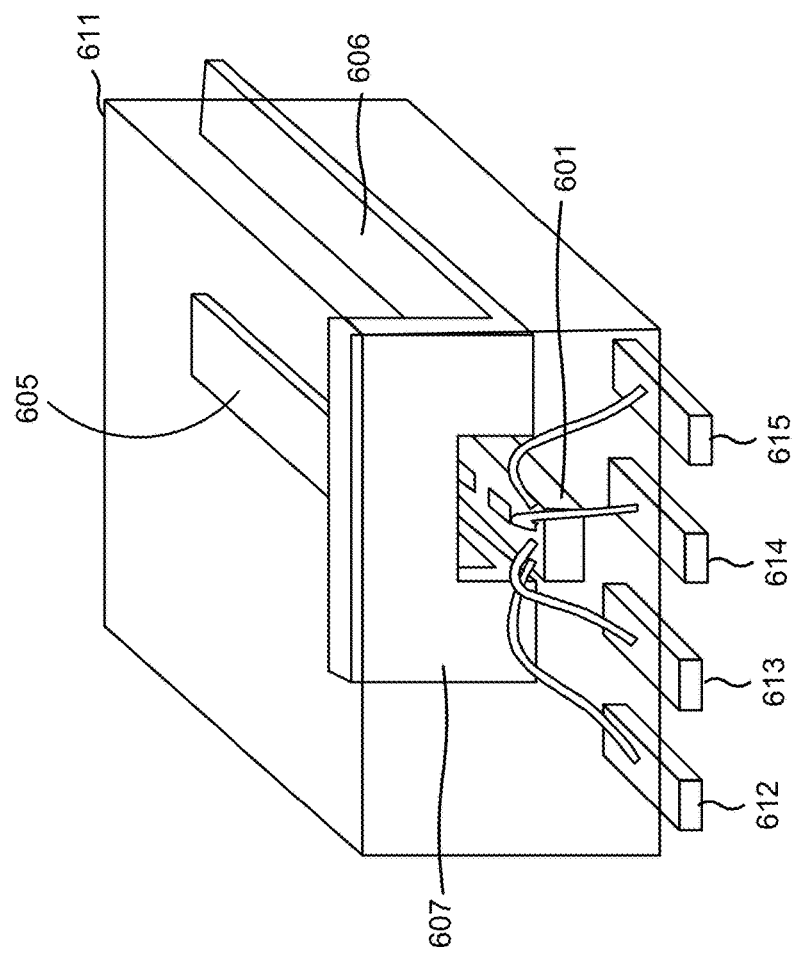
FIG. 6B illustrates a current sensor system according to one or more implementations.
Figure 6C:
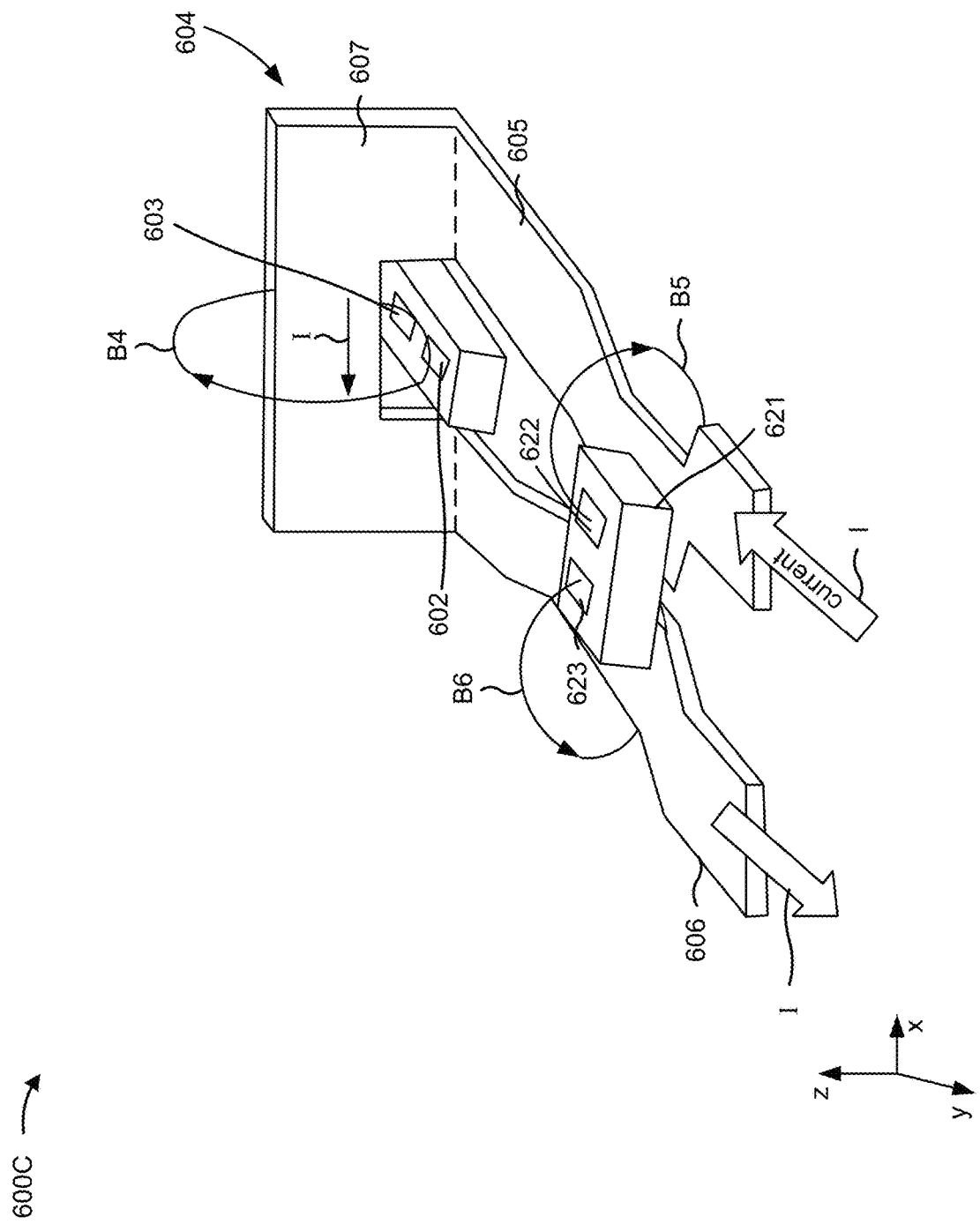
FIG. 6C illustrates a current sensor system according to one or more implementations.
Figure 6D:
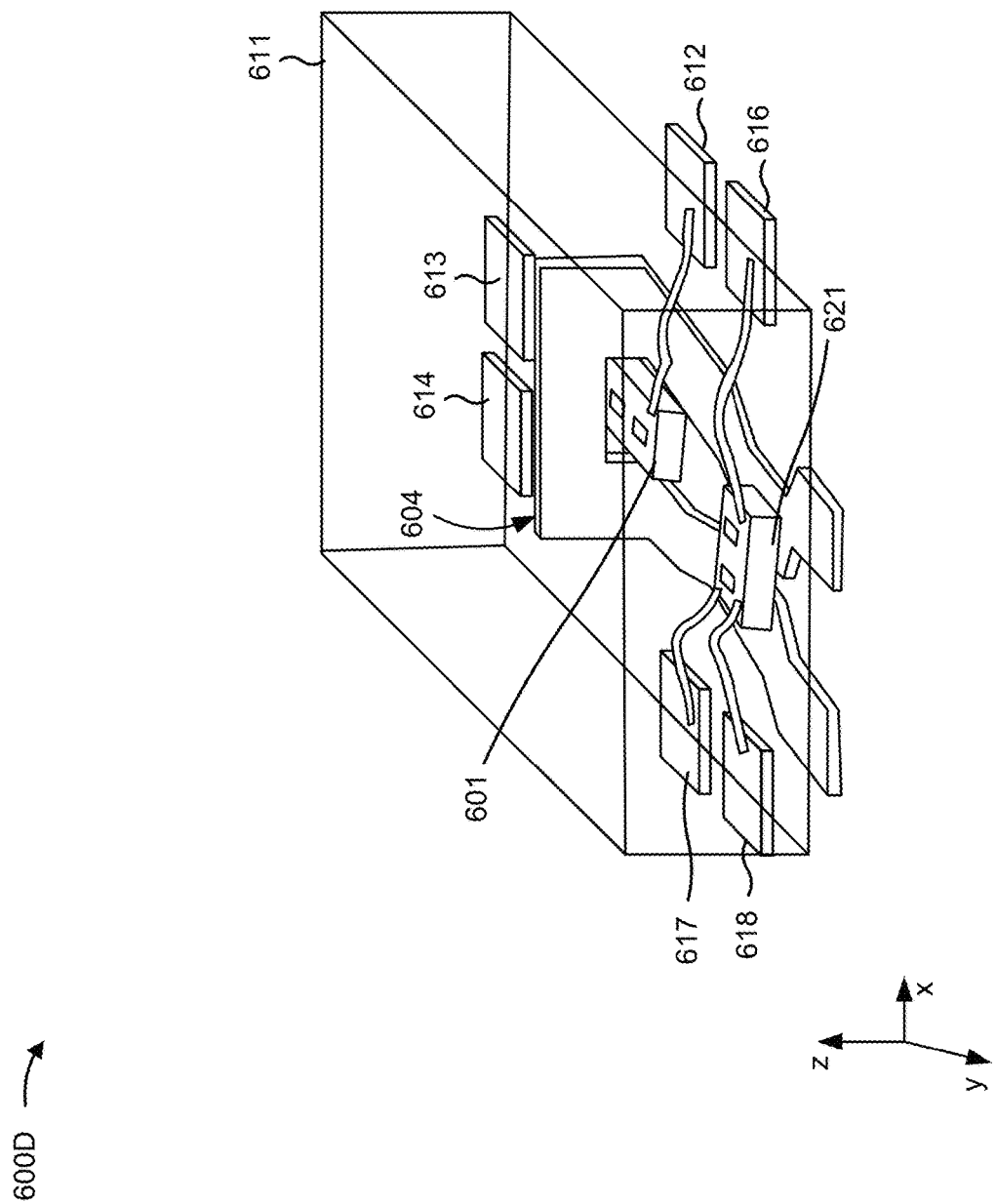
FIG. 6D illustrates a current sensor system according to one or more implementations.

FIG. 6A illustrates a current sensor system 600A according to one or more implementations. FIG. 6B illustrates a current sensor system 600B according to one or more implementations. In particular, the current sensor system 600B is similar to the current sensor system 600A, but implemented in a chip package. FIG. 6C illustrates a current sensor system 600C according to one or more implementations. The current sensor system 600C is a variation of the current sensor system 600A that includes redundant current sensing. FIG. 6D illustrates a current sensor system 600D according to one or more implementations. In particular, the current sensor system 600D is similar to the current sensor system 600C, but implemented in a chip package.

The current sensor system 600A includes a first magnetic field sensor 601. The first magnetic field sensor 601 includes a first sensor element 602 and a second sensor element 603 arranged in a chip plane (e.g., a first x-y plane) of the first magnetic field sensor 601. The first sensor element 602 and the second sensor element 603 are differentially spaced from each other in the y-direction. Furthermore, the first sensor element 602 and the second sensor element 603 are sensitive to an out-of-plane magnetic field component (e.g., the z-magnetic field component Bz) of a magnetic field B4 produced by a current I flowing through a current-carrying conductor 604. For example, the first sensor element 602 and the second sensor element 603 may be vertical Hall effect sensor elements.

The current-carrying conductor 604 includes a first conductor structure 605 that traverses a first part of the current sensor system 600A in a conductor plane (e.g., a second x-y plane) that is parallel to the chip plane, a second conductor structure 606 that traverses a second part of the current sensor system 600A in the conductor plane, and a third conductor structure 607 that is electrically coupled to and between the first conductor structure 605 and the second conductor structure 606. The first conductor structure 605 is configured to carry the current I parallel to the chip plane (e.g., in a negative y-direction), the second conductor structure 606 is also configured to carry the current I parallel to the chip plane (e.g., in a positive y-direction), and the third conductor structure 607 is configured to receive the current I from the first conductor structure 605 and provide the current I to the second conductor structure 606. The first magnetic field sensor 601 is arranged between the first conductor structure 605 and the second conductor structure 606 in the x-direction.

Additionally, the third conductor structure 607 includes a first conductor segment 608 that extends in the z-direction from an end 605a of the first conductor structure 605, a second conductor segment 609 that extends in the z-direction from an end 606a of the second conductor structure 606, and a third conductor segment 610 that extends from the first conductor segment 608 to the second conductor segment 609 in the x-direction that is perpendicular to the y-direction and the z-direction such that the third conductor segment extends over the first magnetic field sensor 601. Accordingly, the current-carrying conductor 604 is bent into an x-z plane to extend vertically over the first magnetic field sensor 601. In this way, the third conductor structure 607 and the current I flowing through the third conductor structure 607 has an orientation relative to the chip plane of the first magnetic field sensor 601 as similarly illustrated in FIGS. 5C and 5D.

While the current-carrying conductor 604 is shown as being bent upwards, the current-carrying conductor 604 could also be bent downwards such that the third conductor segment 610 extends under the first magnetic field sensor 601 instead of over the first magnetic field sensor 601. In either case in which the current-carrying conductor 604 is bent upward or bent downward, the third conductor structure 607 and the current I flowing through the third conductor structure 607 has an orientation relative to the chip plane of the first magnetic field sensor 601 as similarly illustrated in FIGS. 5C and 5D.

Accordingly, a gap between the first sensor element 602 and the second sensor element 603 in the y-direction can be reduced, which leads to a reduction in a chip size of the first magnetic field sensor 601 in a y-dimension. The third conductor segment 610 may be arranged to overlap with the gap in the z-direction so that the first sensor element 602 and the second sensor element 603 are equally, or substantially equally, offset from a center of the third conductor segment 610 in the y-direction.

The current-carrying conductor 604 may be a common conductor structure, such as a lead frame or current rail, where the common conductor structure is a one-piece integral structure having a U-shape. As a result, the first conductor structure 605 and the second conductor structure 606 carry the current I in opposite (e.g., antiparallel direction) in order to provide a more compact configuration.

The first magnetic field sensor 601 may include a sensor circuit for generating a differential measurement signal. In particular, the first sensor element 602 is configured to generate a first sensor signal based on measuring the magnetic field B4 and the second sensor element 603 is configured to generate a second sensor signal based on measuring the magnetic field B4. The sensor circuit is configured to generate a differential measurement signal based on the first sensor signal and the second sensor signal by applying differential calculus to the first sensor signal and the second sensor signal.

FIG. 6B illustrates the current sensor system 600B that includes a chip package (e.g., a sensor package) in which the first magnetic field sensor 601 and the current-carrying conductor 604 of current sensor system 600A are integrated. The chip package may include a housing 611, such as a mold compound or other encapsulant, and a lead frame that includes a plurality of leads 612-615 that are electrically coupled to the first magnetic field sensor 601 to provide supply potentials via bond wires to the first magnetic field sensor 601 and to receive sensor signals or the differential measurement signal from the first magnetic field sensor 601 via one or more bond wires for output from the current sensor system 600B. As noted above, the current-carrying conductor 604 may also be part of the lead frame.

The first sensor element 602 and the second sensor element 603 represent a first set of sensor elements that are sensitive to the z-magnetic field component Bz of the magnetic field B4 and can be used to derive a differential measurement signal that cancels out homogenous magnetic stray fields. In order to provide redundant current sensing, additional sets of sensor elements can be provided. For example, FIG. 6C illustrates the current sensor system 600C with a second magnetic field sensor 621 that is provided in addition to the first magnetic field sensor 601. The second magnetic field sensor 621 includes a second set of sensor elements, including a third sensor element 622 and a fourth sensor element 623 that are sensitive to an in-plane magnetic field component (e.g., an x-magnetic field component). Accordingly, the third sensor element 622 and the fourth sensor element 623 may be xMR sensor elements or vertical Hall effect sensor elements.

The second magnetic field sensor 621 is arranged such that the third sensor element 622 is arranged over the first conductor structure 605 and the fourth sensor element 623 is arranged over the second conductor structure 606. The first conductor structure 605 and the second conductor structure 606 may each extend inwards toward each other in a region of the second magnetic field sensor 621 so as to not impact a chip size of the second magnetic field sensor 621. This allows the chip size of the second magnetic field sensor 621 to remain small. However, it will be appreciated that, in some implementations, a shape of the current-carrying conductor 604 may be different while still accommodating the chip size of the second magnetic field sensor 621.

The current I produces a magnetic field B5 as the current I flows through first conductor structure 605 and produces a magnetic field B6 as the current I flows through the second conductor structure 606. Since a flow direction of the current I in the first conductor structure 605 is opposite to the flow direction of the current I in the second conductor structure 606, the magnetic field B5 and the magnetic field B6 have equal magnetic field flux densities at the second magnetic field sensor 621 but opposite field orientations. Thus, the third sensor element 622 and the fourth sensor element 623 sense the same, or substantially the same, magnetic field flux density but with different signs. This enables the third sensor element 622 and the fourth sensor element 623 to be used for differential sensing. In particular, second magnetic field sensor 621 may include another sensor circuit for generating another differential measurement signal. The third sensor element 622 is configured to generate a third sensor signal based on measuring the magnetic field B5 and the fourth sensor element 623 is configured to generate a fourth sensor signal based on measuring the magnetic field B6. The other sensor circuit is configured to generate the other differential measurement signal based on the third sensor signal and the fourth sensor signal by applying differential calculus to the third sensor signal and the fourth sensor signal.

Accordingly, the current sensor system 600C provides redundant current sensing using two different sensor technologies (e.g., xMR and lateral Hall-effect or vertical Hall-effect and lateral Hall-effect). Using two different sensor technologies provides independent current sensing capabilities and provides increased resiliency against faults and external factors. For example, two different sensor technologies are less likely to be vulnerable to a same error. Furthermore, an external interference is less likely to affect both sets of sensor elements since one set of sensor elements is sensitive to an in-plane field component and insensitive to other magnetic field components, while the other set of sensor elements is sensitive to an out-of-plane field component and insensitive to other magnetic field components.

Moreover, a current path formed by the current-carrying conductor 604 is not restricted by a narrowed current restriction region that increases power losses. Thus, a geometry of the current path is capable of providing detectable magnetic fields without introducing additional power losses.

FIG. 6D illustrates the current sensor system 600D that includes a chip package (e.g., a sensor package) in which the first magnetic field sensor 601 and the current-carrying conductor 604 are integrated. The chip package may include the housing 611, such as such as a mold compound or other encapsulant, and the lead frame that includes a plurality of leads 612-614 that are electrically coupled to the first magnetic field sensor 601 and plurality of leads 616-618 that are electrically coupled to the second magnetic field sensor 621. The plurality of leads 612-614 may provide supply potentials via bond wires to the first magnetic field sensor 601 and receive sensor signals or the differential measurement signal from the first magnetic field sensor 601 via one or more bond wires for output from the current sensor system 600. Similarly, the plurality of leads 616-618 may provide supply potentials via bond wires to the second magnetic field sensor 621 and receive sensor signals or the differential measurement signal from the second magnetic field sensor 621 via one or more bond wires for output from the current sensor system 600. The current-carrying conductor 604 may also be part of the lead frame.

As indicated above, FIGS. 6A-6D are provided merely as examples. Other examples are possible and may differ from what was described with regard to FIGS. 6A-6D. For example, in some implementations, the chip package may include more or fewer leads than a quantity that is shown in FIGS. 6B and 6D. In some implementations, a different type of conductive structures may be used. In some implementations, the chip package may be a flip chip package that uses flip chip interconnects instead of bond wires. In some implementations, additional circuit components may be integrated within, or attached to, the current sensor systems 600A-600D without deviating from the disclosure provided above.

Figure 7:
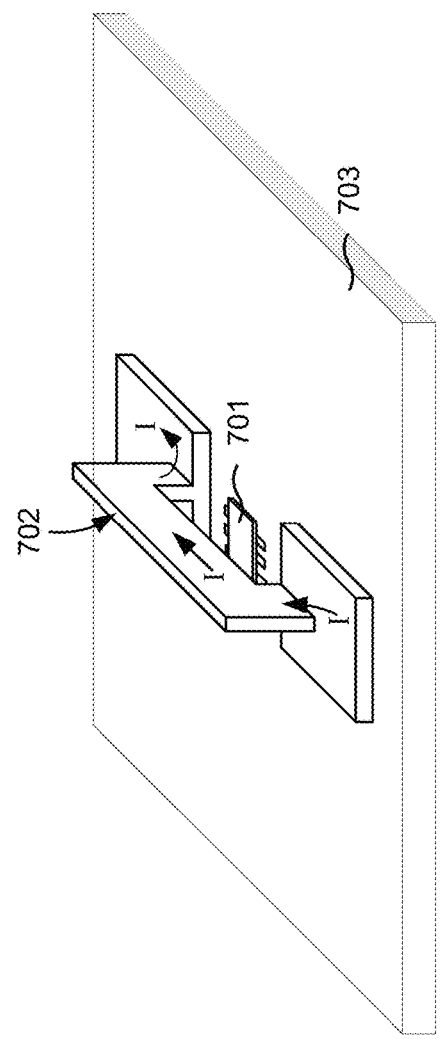
FIG. 7 illustrates a current sensor system according to one or more implementations.

FIG. 7 illustrates a current sensor system 700 according to one or more implementations. The current sensor system 700 includes a chip package 701 that includes a magnetic field sensor. The current sensor system 700 further includes a current-carrying conductor 702 that vertically extends over the chip package 701. The magnetic field sensor integrated inside the chip package 701 is arranged relative to the current-carrying conductor 702 in a similar manner described above with respect to FIG. 6A. However, because the current-carrying conductor 702 is arranged external to the chip package 701, the current-carrying conductor 702 is an external current rail. The magnetic field sensor includes two sensor elements (not illustrated) that are sensitive to an out-of-plane magnetic field component (e.g., the z-magnetic field component Bz) of a magnetic field generated by a current I that flows through the current-carrying conductor 702. The two sensor elements are differentially spaced with respect to the current-carrying conductor 702 to enable differential sensing of the magnetic field. The current sensor system 700 further includes a circuit substrate 703 (e.g., a PCB) onto which the chip package 701 and the current-carrying conductor 702 are mounted.

The number and arrangement of components shown in FIG. 7 are provided as an example. In practice, current sensor system 700 may include additional components, fewer components, different components, or differently arranged components than those shown in FIG. 7.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein refers to any of the foregoing structures or any other structure suitable for implementation of the techniques described herein.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A current sensor system, comprising:
   a magnetic field sensor comprising a chip plane, a first set of sensor elements sensitive to a first magnetic field component that is aligned in a first direction that is parallel to the chip plane, and a second set of sensor elements sensitive to a second magnetic field component that is aligned in a second direction that is perpendicular to the chip plane, wherein the first set of sensor elements comprise a first sensor element and a second sensor element, and wherein the second set of sensor elements comprise a third sensor element and a fourth sensor element;
   a first conductor structure that traverses a first part of the current sensor system in a third direction that is perpendicular to the first direction and the second direction, wherein the first conductor structure is configured to carry a current parallel to the third direction;
   a second conductor structure electrically connected to the first conductor structure, wherein the second conductor structure traverses a second part of the current sensor system in the third direction, wherein the second conductor structure is configured to carry the current antiparallel to the third direction; and
   a third conductor structure electrically connected to the second conductor structure, wherein the third conductor structure traverses a third part of the current sensor system in the third direction, wherein the third conductor structure is configured to carry the current parallel to the third direction,
   wherein the first conductor structure produces a first magnetic field based on the current flowing therethrough, the second conductor structure produces a second magnetic field based on the current flowing therethrough, and the third conductor structure produces a third magnetic field based on the current flowing therethrough, and
   wherein the first magnetic field, the second magnetic field, and the third magnetic field produce a first magnetic field distribution of the first magnetic field component and a second magnetic field distribution of the second magnetic field component.

2. The current sensor system of claim 1, wherein the first sensor element is arranged at a first extremum of the first magnetic field distribution of the first magnetic field component, the second sensor element is arranged at a second extremum of the first magnetic field distribution of the first magnetic field component, the third sensor element is arranged at a first extremum of the second magnetic field distribution of the second magnetic field component, and the fourth sensor element is arranged at a second extremum of the second magnetic field distribution of the second magnetic field component.

3. The current sensor system of claim 2, wherein:
   the first sensor element and the second sensor element are arranged at first sensor locations at which the second magnetic field distribution of the second magnetic field component is substantially zero, and
   the third sensor element and the fourth sensor element are arranged at second sensor locations at which the first magnetic field distribution of the first magnetic field component is substantially zero.

4. The current sensor system of claim 2, wherein:
   the first extremum of the first magnetic field distribution of the first magnetic field component is a local minimum of the first magnetic field distribution,
   the second extremum of the first magnetic field distribution of the first magnetic field component is local maximum of the first magnetic field distribution,
   the first extremum of the second magnetic field distribution of the second magnetic field component is a local minimum of the second magnetic field distribution, and
   the second extremum of the second magnetic field distribution of the second magnetic field component is a local maximum of the second magnetic field distribution.

5. The current sensor system of claim 1, wherein the second conductor structure is configured to cause the current to flow from the first conductor structure to the third conductor structure.

6. The current sensor system of claim 1, further comprising:
a common conductor structure comprising the first conductor structure, the second conductor structure, and the third conductor structure, wherein the common conductor structure is a one-piece integral structure.

7. The current sensor system of claim 6, further comprising:
a lead frame electrically connected to the magnetic field sensor, wherein the lead frame comprises the common conductor structure.

8. The current sensor system of claim 1, further comprising:
a first bond pad to which the first conductor structure and the second conductor structure are electrically coupled, and
a second bond pad to which the second conductor structure and the third conductor structure are electrically coupled,
wherein the first conductor structure, the second conductor structure, and the third conductor structure are bond wires.

9. The current sensor system of claim 1, wherein:
the first conductor structure, the second conductor structure, and the third conductor structure are laterally spaced apart in the first direction, and
the second conductor structure is arranged between the first conductor structure and the third conductor structure in the first direction.

10. The current sensor system of claim 9, wherein the first sensor element and the first conductor structure overlap in the second direction, and the second sensor element and the second conductor structure overlap in the second direction.

11. The current sensor system of claim 10, wherein the third sensor element is arranged between the first conductor structure and the second conductor structure in the first direction, and the fourth sensor element is arranged between the second conductor structure and the third conductor structure in the first direction.

12. The current sensor system of claim 1, further comprising:
a sensor circuit,
wherein the first sensor element is configured to generate a first sensor signal based on measuring the first magnetic field component,
wherein the second sensor element is configured to generate a second sensor signal based on measuring the first magnetic field component,
wherein the third sensor element is configured to generate a third sensor signal based on measuring the second magnetic field component,
wherein the fourth sensor element is configured to generate a fourth sensor signal based on measuring the second magnetic field component, and
wherein the sensor circuit is configured to generate a first differential measurement signal based on the first sensor signal and the second sensor signal and generate a second differential measurement signal based on the third sensor signal and the fourth sensor signal.

13. The current sensor system of claim 1, wherein the magnetic field sensor comprises:
a first sensor chip comprising the first sensor element and the second sensor element; and
a second sensor chip comprising the third sensor element and the fourth sensor element,
wherein the first sensor element is configured to generate a first sensor signal based on measuring the first magnetic field component,
wherein the second sensor element is configured to generate a second sensor signal based on measuring the first magnetic field component,
wherein the third sensor element is configured to generate a third sensor signal based on measuring the second magnetic field component,
wherein the fourth sensor element is configured to generate a fourth sensor signal based on measuring the second magnetic field component,
wherein the first sensor chip comprises a first sensor circuit configured to generate a first differential measurement signal based on the first sensor signal and the second sensor signal, and
wherein the second sensor chip comprises a second sensor circuit configured to generate a second differential measurement signal based on the third sensor signal and the fourth sensor signal.

14. The current sensor system of claim 1, wherein:
the first sensor element and the second sensor element are substantially insensitive to the second magnetic field component, and
the third sensor element and the fourth sensor element are substantially insensitive to the first magnetic field component.

15. The current sensor system of claim 1, wherein:
the first sensor element and the second sensor element are magnetoresistance sensor elements or vertical Hall-effect sensor elements, and
the third sensor element and the fourth sensor element are lateral Hall-effect sensor elements.

16. The current sensor system of claim 1, further comprising:
a chip package, wherein the magnetic field sensor, the first conductor structure, the second conductor structure, and the third conductor structure are integrated within the chip package.

17. The current sensor system of claim 1, wherein the first set of sensor elements and the second set of sensor elements are arranged in the chip plane.

18. A current sensor system, comprising:
a magnetic field sensor comprising a chip plane, a first set of sensor elements sensitive to a first magnetic field component that is aligned in a first direction that is parallel to the chip plane, and a second set of sensor elements sensitive to a second magnetic field component that is aligned in a second direction that is perpendicular to the chip plane, wherein the first set of sensor elements comprise a first sensor element and a second sensor element, and wherein the second set of sensor elements comprise a third sensor element and a fourth sensor element;
a first conductor structure that traverses a first part of the current sensor system in a third direction that is perpendicular to the first direction and the second direction, wherein the first conductor structure is configured to carry a current parallel to the third direction;
a second conductor structure electrically connected to the first conductor structure, wherein the second conductor structure traverses a second part of the current sensor system in the first direction, wherein the second conductor structure is configured to carry the current parallel to the first direction; and a third conductor structure electrically connected to the second conductor structure, wherein the third conductor structure traverses a third part of the current sensor system in the third direction, wherein the third conductor structure is configured to carry the current antiparallel to the third direction, wherein the first conductor structure produces a first magnetic field based on the current flowing therethrough, the second conductor structure produces a second magnetic field based on the current flowing therethrough, the third conductor structure produces a third magnetic field based on the current flowing therethrough, and wherein the first magnetic field, the second magnetic field, and the third magnetic field produce a first magnetic field distribution of the first magnetic field component and a second magnetic field distribution of the second magnetic field component.

19. The current sensor system of claim 18, wherein the first sensor element is arranged at a first extremum of the first magnetic field distribution of the first magnetic field component, the second sensor element is arranged at a second extremum of the first magnetic field distribution of the first magnetic field component, the third sensor element is arranged at a first extremum of the second magnetic field distribution of the second magnetic field component, and the fourth sensor element is arranged at a second extremum of the second magnetic field distribution of the second magnetic field component.

20. The current sensor system of claim 18, further comprising:
a common conductor structure comprising the first conductor structure, the second conductor structure, and the third conductor structure, wherein the common conductor structure is a one-piece integral structure having a U-shape,
wherein the second conductor structure is configured to cause the current to flow from the first conductor structure to the third conductor structure.

21. The current sensor system of claim 20, wherein the first sensor element and the first conductor structure overlap in the second direction, and the second sensor element and the third conductor structure overlap in the second direction.

22. The current sensor system of claim 21, wherein:
the third sensor element and the fourth sensor element are arranged between the first conductor structure and the third conductor structure in the first direction, and
the third sensor element and the fourth sensor element are offset from the second conductor structure in the third direction.

23. A current sensor system, comprising:
a magnetic field sensor comprising a chip plane and a first set of sensor elements arranged in the chip plane and sensitive to a first magnetic field component that is aligned in a first direction that is perpendicular to the chip plane, wherein the first set of sensor elements comprise a first sensor element and a second sensor element;
a first conductor structure that traverses a first part of the current sensor system in a conductor plane that is parallel to the chip plane, wherein the first conductor structure is configured to carry a current parallel to the chip plane;
a second conductor structure that traverses a second part of the current sensor system, wherein the second conductor structure is configured to carry the current parallel to the chip plane; and
a third conductor structure electrically coupled to and between the first conductor structure and the second conductor structure, wherein the third conductor structure is configured to receive the current from the first conductor structure and provide the current to the second conductor structure,
wherein the third conductor structure comprises:
a first conductor segment that extends in the first direction from an end of the first conductor structure;
a second conductor segment that extends in the first direction from an end of the second conductor structure; and
a third conductor segment that extends from the first conductor segment to the second conductor segment in a second direction that is perpendicular to the first direction such that the third conductor segment extends past the magnetic field sensor.

24. The current sensor system of claim 23, wherein:
the first sensor element and the second sensor element are separated in a third direction by a gap, wherein the third direction is perpendicular to the first direction and the second direction, and
the third conductor segment is arranged over the gap.

25. The current sensor system of claim 23, wherein the magnetic field sensor is a sensor chip arranged between the first conductor structure and the second conductor structure in the second direction.

26. The current sensor system of claim 23, further comprising:
a common conductor structure comprising the first conductor structure, the second conductor structure, and the third conductor structure, wherein the common conductor structure is a one-piece integral structure having a U-shape.

27. The current sensor system of claim 26, wherein the common conductor structure is a lead frame.

28. The current sensor system of claim 23, wherein:
the first conductor structure extends in a third direction that is perpendicular to the first direction and the second direction and is configured to carry the current parallel to the third direction, and
the second conductor structure extends in the third direction and is configured to carry the current antiparallel to the third direction.

29. The current sensor system of claim 23, wherein:
the magnetic field sensor is a sensor chip comprising a sensor circuit,
the first sensor element is configured to generate a first sensor signal based on measuring the first magnetic field component,
the second sensor element is configured to generate a second sensor signal based on measuring the first magnetic field component, and
the sensor circuit is configured to generate a differential measurement signal based on the first sensor signal and the second sensor signal.

30. The current sensor system of claim 23, further comprising:
a chip package, wherein the magnetic field sensor, the first conductor structure, the second conductor structure, and the third conductor structure are integrated within the chip package.

31. The current sensor system of claim 23, wherein the magnetic field sensor further comprises:
a second set of sensor elements sensitive to a second magnetic field component that is aligned in the second direction that is parallel to the chip plane, wherein the second set of sensor elements comprise a third sensor element and a fourth sensor element,
wherein the third sensor element overlaps with the first conductor structure in the first direction, and
wherein the fourth sensor element overlaps with the second conductor structure in the first direction.

32. The current sensor system of claim 31, wherein the magnetic field sensor comprises:
a first sensor chip comprising the first sensor element and the second sensor element; and
a second sensor chip comprising the third sensor element and the fourth sensor element,
wherein the first sensor element is configured to generate a first sensor signal based on measuring the first magnetic field component,
wherein the second sensor element is configured to generate a second sensor signal based on measuring the first magnetic field component,
wherein the third sensor element is configured to generate a third sensor signal based on measuring the second magnetic field component,
wherein the fourth sensor element is configured to generate a fourth sensor signal based on measuring the second magnetic field component,
wherein the first sensor chip comprises a first sensor circuit configured to generate a first differential measurement signal based on the first sensor signal and the second sensor signal, and
wherein the second sensor chip comprises a second sensor circuit configured to generate a second differential measurement signal based on the third sensor signal and the fourth sensor signal.

* * * * *